United States Patent
Ichinoseki et al.

(10) Patent No.: US 12,255,254 B2
(45) Date of Patent: *Mar. 18, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Kentaro Ichinoseki, Nonoichi (JP); Tatsuya Nishiwaki, Nonoichi (JP); Kikuo Aida, Nomi (JP); Kohei Oasa, Nonoichi (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/481,847

(22) Filed: Oct. 5, 2023

(65) Prior Publication Data

US 2024/0047571 A1 Feb. 8, 2024

Related U.S. Application Data

(63) Continuation of application No. 17/579,636, filed on Jan. 20, 2022, now Pat. No. 11,810,975, which is a
(Continued)

(30) Foreign Application Priority Data

Mar. 15, 2019 (JP) .................................. 2019-048329

(51) Int. Cl.
*H01L 29/78* (2006.01)
*H01L 29/423* (2006.01)

(52) U.S. Cl.
CPC ...... *H01L 29/7813* (2013.01); *H01L 29/4236* (2013.01)

(58) Field of Classification Search
CPC ............. H01L 29/7813; H01L 29/4236; H01L 2224/0603; H01L 23/4824;
(Continued)

(56) References Cited

U.S. PATENT DOCUMENTS 6,337,498 B1 * 1/2002 Hasegawa ........... H01L 29/0696
257/328
8,183,600 B2 * 5/2012 Shimizu ............ H01L 27/11807
257/207
(Continued)

FOREIGN PATENT DOCUMENTS

JP 3410949 B2 5/2003
JP 2011-086746 A 4/2011
(Continued)

OTHER PUBLICATIONS

Decision to Grant a Patent mailed Jul. 9, 2024 in corresponding Japanese Patent Application No. 2023-017796, 5 pages (with English Translation).

*Primary Examiner* — Khaja Ahmad
*Assistant Examiner* — Khatib A Rahman
(74) *Attorney, Agent, or Firm* — Kim & Stewart LLP

(57) ABSTRACT

According to one embodiment, a semiconductor device includes: a semiconductor layer including a first plane extending along a plane including a first axis and a second axis; a first electrode extending along the first axis; a second electrode extending along the second axis; and a third electrode above the first plane. The third electrode is electrically coupled to the first electrode and the second electrode, and includes a first portion, a second portion and a third portion. The first portion crosses the first electrode. The second portion crosses the second electrode. The third portion crosses the second electrode and is separate at a first end from the second portion.

24 Claims, 13 Drawing Sheets

Related U.S. Application Data continuation of application No. 16/558,530, filed on Sep. 3, 2019, now Pat. No. 11,276,775.

(58) Field of Classification Search
CPC ............. H01L 29/41766; H01L 29/407; H01L 29/0696; H01L 29/41741; H01L 29/7827
See application file for complete search history.

(56) References Cited

U.S. PATENT DOCUMENTS

| | | | |
|---|---|---|---|
| 8,643,095 B2 | 2/2014 | Suzuki et al. | |
| 8,872,257 B1 | 10/2014 | Matsuoka et al. | |
| 8,884,364 B2 * | 11/2014 | Nishiwaki | H01L 29/407 |
| | | | 257/331 |
| 9,041,098 B2 * | 5/2015 | Ichinoseki | H01L 29/4238 |
| | | | 257/330 |
| 2008/0197406 A1 | 8/2008 | Parthasarathy et al. | |
| 2015/0021719 A1 * | 1/2015 | Tanaka | B81B 3/0013 |
| | | | 257/415 |
| 2016/0079375 A1 * | 3/2016 | Yamazaki | H01L 29/4238 |
| | | | 257/330 |
| 2016/0268419 A1 * | 9/2016 | Kawaguchi | H01L 29/1095 |
| 2017/0098647 A1 | 4/2017 | Uchida et al. | |
| 2017/0222038 A1 * | 8/2017 | Katou | H01L 29/42376 |
| 2017/0250194 A1 * | 8/2017 | Lee | H01L 27/1157 |
| 2017/0263767 A1 * | 9/2017 | Nishiwaki | H01L 29/66734 |
| 2018/0076307 A1 * | 3/2018 | Shimomura | H01L 29/7805 |
| 2018/0240867 A1 | 8/2018 | Nitta et al. | |
| 2018/0342604 A1 * | 11/2018 | Ogura | H01L 23/535 |
| 2019/0244879 A1 * | 8/2019 | Ohoka | H01L 29/4238 |
| 2020/0083320 A1 * | 3/2020 | Ohta | H01L 29/1095 |
| 2020/0220002 A1 * | 7/2020 | Shindome | H01L 23/4824 |
| 2020/0328146 A1 * | 10/2020 | Kajiwara | H01L 23/3171 |
| 2021/0151589 A1 * | 5/2021 | Shoji | H01L 29/402 |

FOREIGN PATENT DOCUMENTS

| | | |
|---|---|---|
| JP | 5011843 B2 | 8/2012 |
| JP | 2013-069783 A | 4/2013 |
| JP | 5214288 B2 | 6/2013 |
| JP | 2017-069551 A | 4/2017 |
| JP | 6271155 B2 | 1/2018 |
| JP | 6317727 B2 | 4/2018 |
| JP | 2018-137324 A | 8/2018 |

* cited by examiner

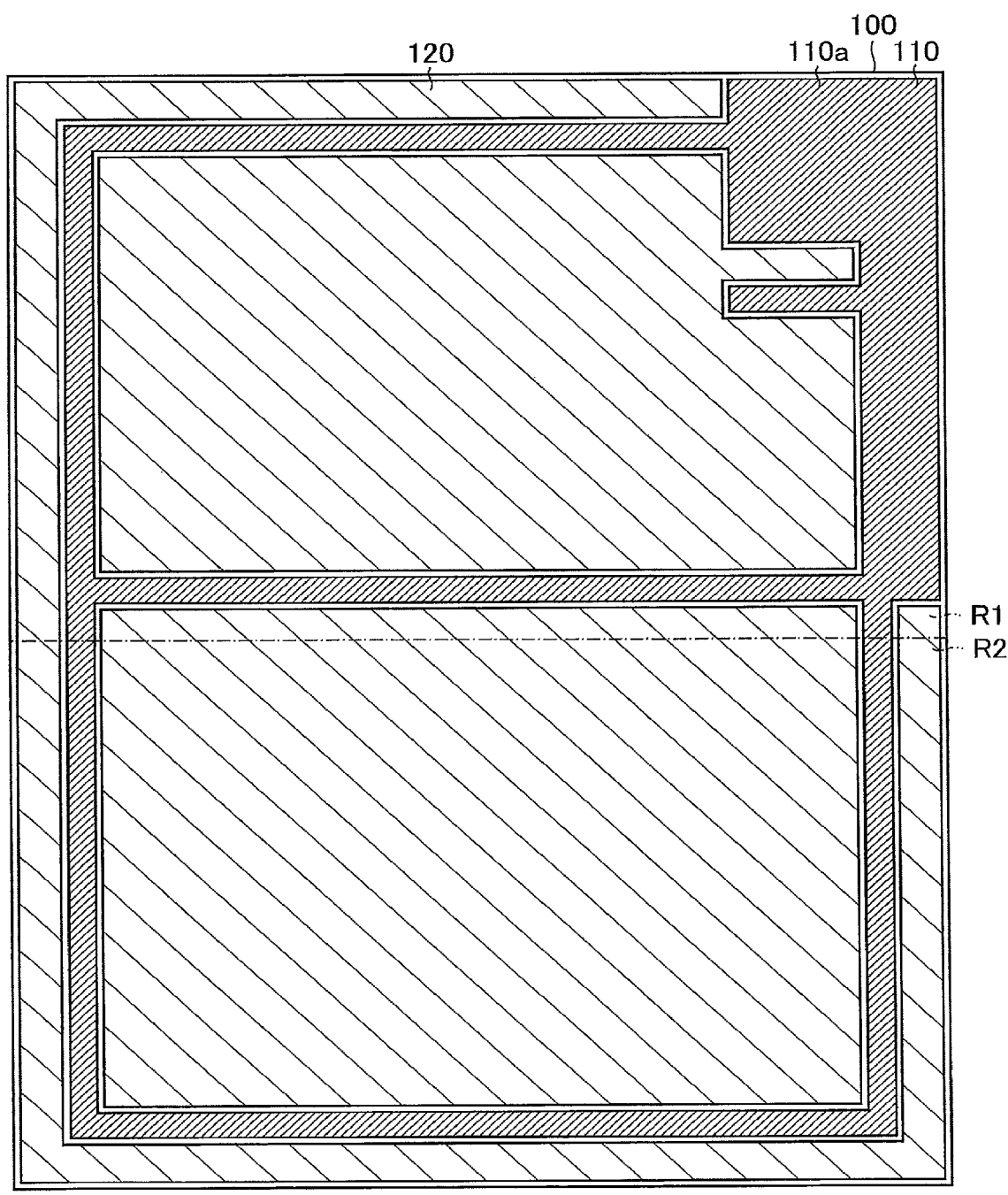
F I G. 6

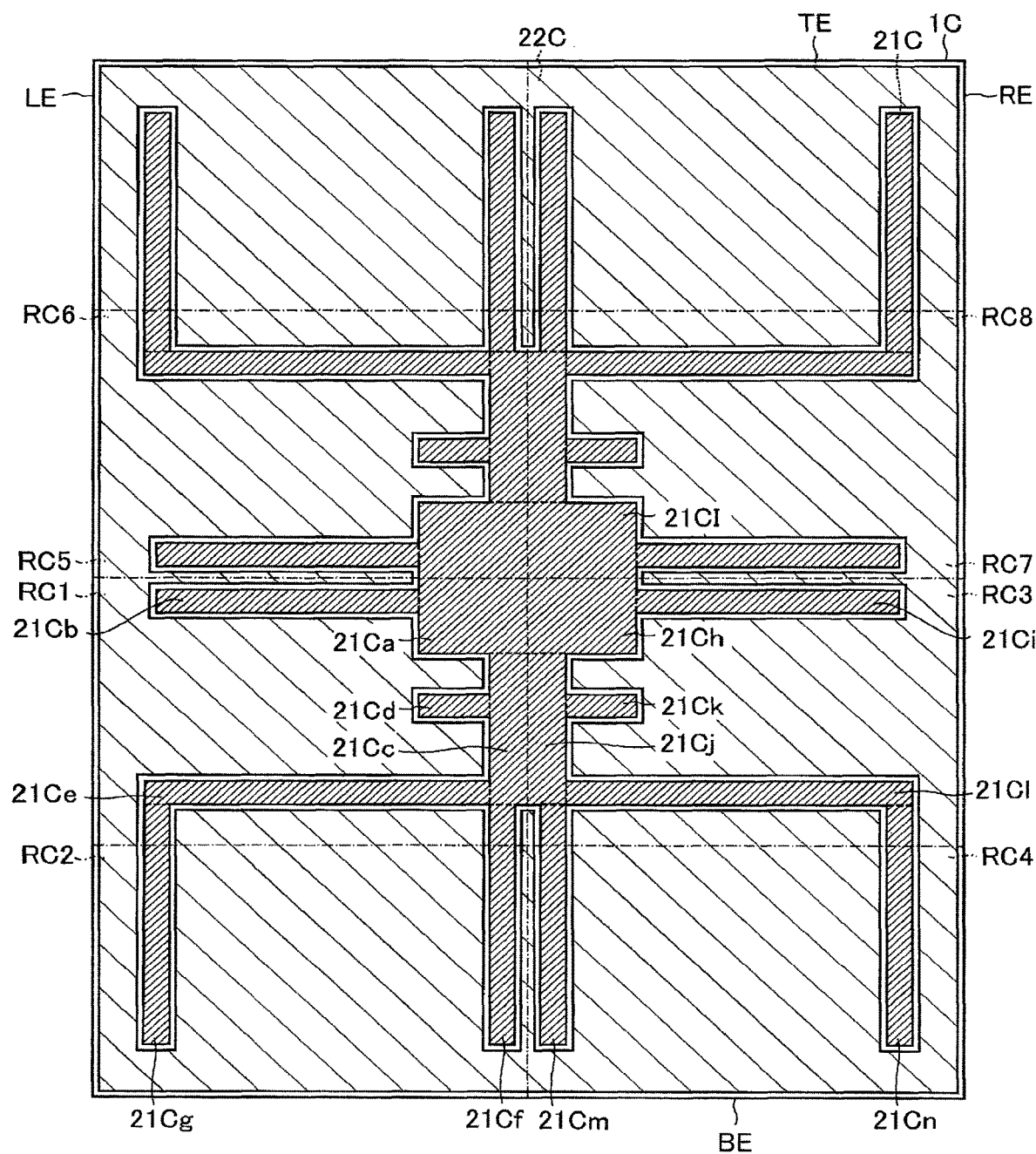
F I G. 13

SEMICONDUCTOR DEVICE

CROSS-REFERENCE TO RELATED APPLICATIONS

This application is a continuation of application Ser. No. 17/579,636 filed Jan. 20, 2022, which is a continuation of application Ser. No. 16/558,530 filed Sep. 30, 2019 (now U.S. Pat. No. 11,276,775) and is based upon and claims the benefit of priority from Japanese Patent Application No. 2019-48329 filed Mar. 15, 2019, the entire contents of each of which are incorporated herein by reference.

FIELD

Embodiments described herein relate generally to a semiconductor device.

BACKGROUND

There is known a semiconductor device of a vertical-type metal oxide semiconductor field effect transistor (MOSFET) which is used for power control or the like.

BRIEF DESCRIPTION OF THE DRAWINGS

FIG. 6 illustrates a plan-view structure of a semiconductor device for a first reference.

FIG. 13 illustrates a plan-view structure of the semiconductor device of the fourth embodiment.

DETAILED DESCRIPTION

Figure 1:
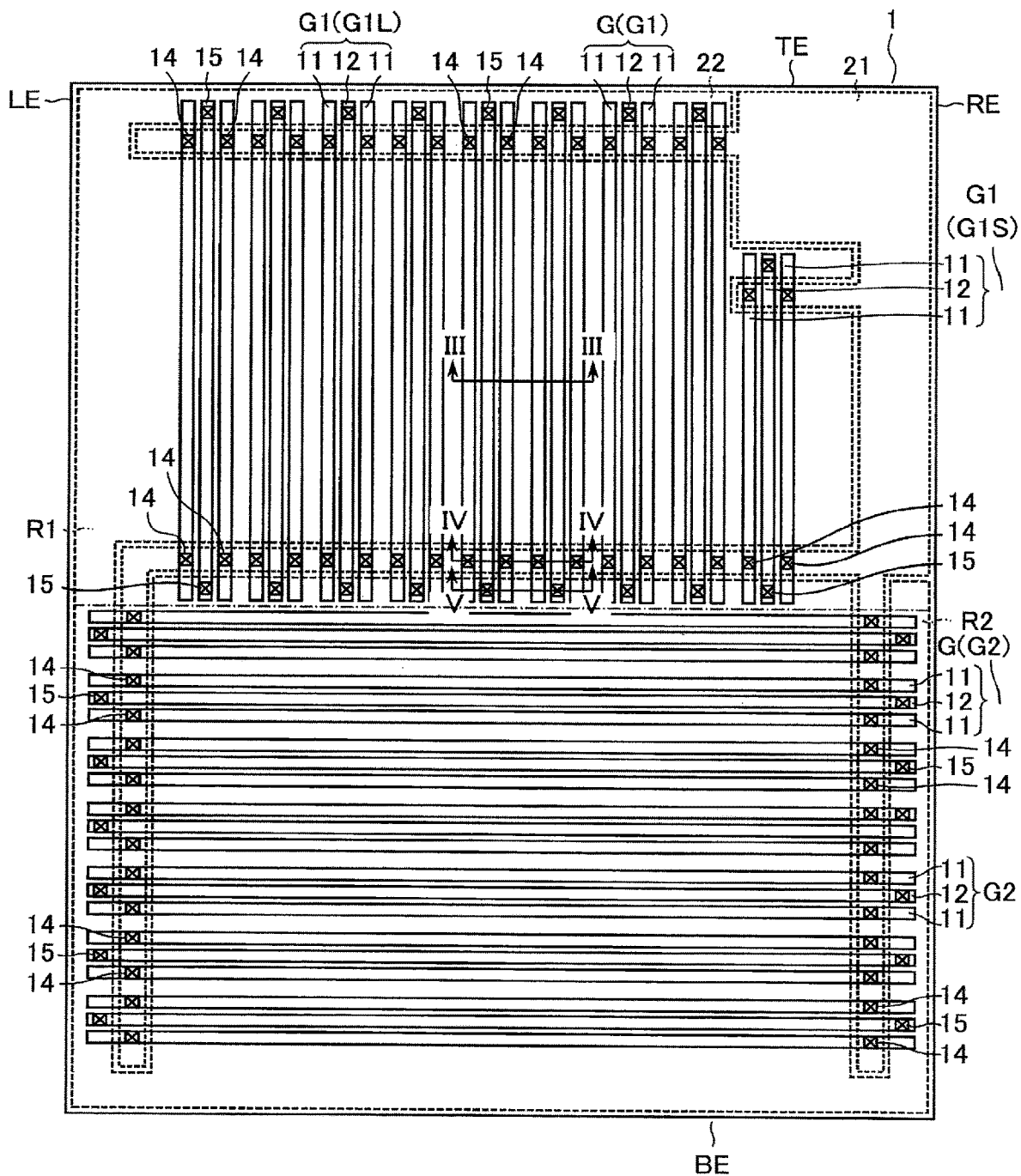
FIG. 1 illustrates a plan-view structure of a semiconductor device of a first embodiment.

In general, according to one embodiment, a semiconductor device includes: a semiconductor layer including a first plane extending along a plane including a first axis and a second axis; a first electrode extending along the first axis; a second electrode extending along the second axis; and a third electrode above the first plane. The third electrode is electrically coupled to the first electrode and the second electrode, and includes a first portion, a second portion and a third portion. The first portion crosses the first electrode. The second portion crosses the second electrode. The third portion crosses the second electrode and is separate at a first end from the second portion.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Moreover, the figures may include components which differ in relations and/or ratios of dimensions in different figures. Moreover, the entire description for a particular embodiment also applies to another embodiment unless it is explicitly mentioned otherwise or obviously eliminated. Each embodiment illustrates the device and method for materializing the technical idea of that embodiment, and the technical idea of an embodiment does not specify the quality of the material, shape, structure, arrangement of components, etc. to the following.

In the description below, an xyz orthogonal coordinate system is used. In the following description, "upper" refers to a larger coordinate on a y axis, and "lower" refers to a smaller coordinate on a y axis. The "right" refers to a larger coordinate on an x axis, and "left" refers to a smaller coordinate on x axis.

First Embodiment

Figure 2:
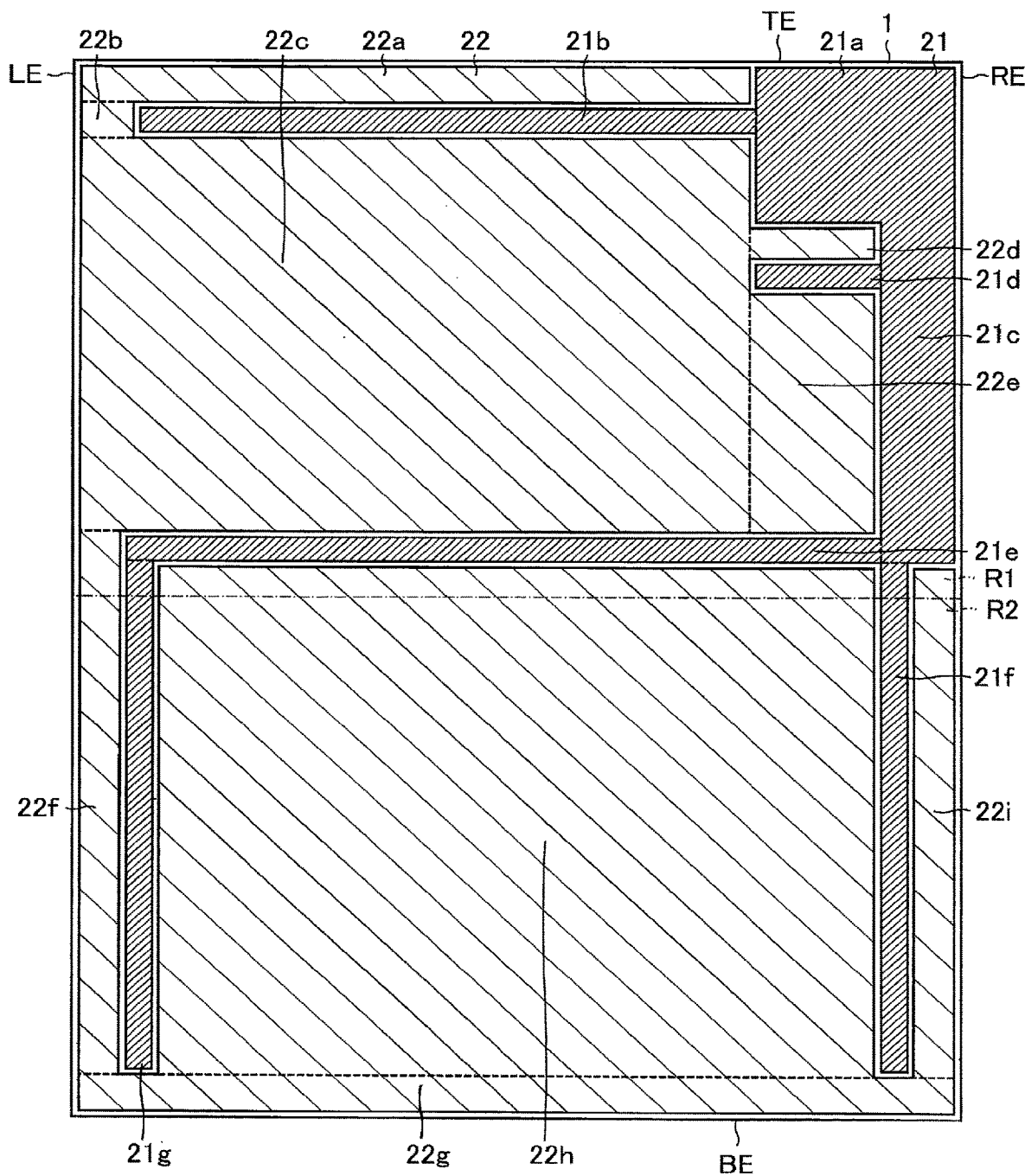
FIG. 2 illustrates a plan-view structure of the semiconductor device of the first embodiment.
Figure 2:
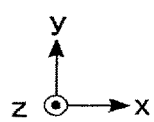

FIG. 1 and FIG. 2 illustrate plan-view structures of a semiconductor device 1 of a first embodiment, and illustrates the structures along an xy plane. The semiconductor device 1 is formed, for example, as one semiconductor chip, and includes a semiconductor substrate (not shown), which will be described later, and also includes conductors and insulators provided on the semiconductor substrate. FIG. 1 and FIG. 2 illustrate structures at different coordinates on a z axis. FIG. 2 illustrates a structure at a z-axis coordinate than greater than a z-axis coordinate at which the structure is shown in FIG. 1, and illustrates an area the same as the area shown in FIG. 1.

As illustrated in FIG. 1, a plane along the xy plane of the semiconductor device 1 has a quadrangle shape, and includes two edges LE and RE extending along the y axis, and two edges TE and BE extending along the x axis. For example, the edges LE, RE, TE and BE are a left edge, a right edge, an upper edge and a lower edge of the plane along the xy plane of the semiconductor device 1.

The semiconductor device 1 includes a first region R1 and a second region R2. The first region R1 and second region R2 spread along the xy plane and do not overlap each other. For example, the entire plane along the xy plane of the semiconductor device 1 is divided into the first region R1 and second region R2. The first region R1 occupies an upper-side part of the entire plane along the xy plane of the semiconductor device 1, and the second region R2 occupies a lower-side part of the entire plane along the xy plane of the semiconductor device 1.

The semiconductor device 1 includes a plurality of gate electrodes 11 and a plurality of field plate (FP) electrodes 12. The gate electrodes 11 include gate electrodes 11 extending along the x axis, and gate electrodes 11 extending along the y axis. The FP electrodes 12 include FP electrodes 12 extending along the x axis, and FP electrodes 12 extending along the y axis. The gate electrodes 11 and FP electrodes 12 which extend along the y axis are arranged at intervals along the x axis, and the gate electrodes 11 and FP electrodes 12 which extend along the x axis are arranged at intervals along the y axis.

One FP electrode 12 and two gate electrodes 11 constitute one electrode set G. In each electrode set G, the two gate electrodes 11 sandwich one FP electrode 12. Of all electrode sets G, the electrode sets G in the first region R1 are referred to as "electrode sets G1", and the electrode sets G in the second region R2 are referred to as "electrode sets G2".

The electrode sets G1 extend along the y axis, and are arranged along the x axis between the left edge LE and right edge RE. The electrode sets G1 are composed of electrode sets G1L and G1S. Dimensions of the electrode sets G1L along the y axis is longer than dimensions of the electrode sets G1S along the y axis. Specifically, the dimensions of the gate electrodes 11 and FP electrode 12 in an electrode set G1L along the y axis are longer than the dimensions of the gate electrodes 11 and FP electrode 12 in an electrode set G1S along the y axis. Hereinafter, an adjective regarding a length for a component (a particular noun), such as "long" and short" describes a dimension of the longitudinal of the component, or a dimension of the component along an axis in which the component extends.

The electrode sets G1L are located in a left part of the first region R1 among all electrode sets G1. The electrode sets G1S are located in a right part of the first region R1 among all electrode sets G1. A boundary between the electrode sets G1S and G1L agrees with, for example, an edge of a certain portion of a gate pad 21 (to be described later).

The electrode sets G1L extend between a position very close to the upper edge TE and a position of a boundary between the first region R1 and second region R2. It should suffice if at least the FP electrodes 12 of the electrode sets G1L extend between the position very close to the upper edge TE and the position of the boundary between the first region R1 and second region R2. The gate electrodes 11 of the electrode sets G1L may be, at one or both ends thereof, shorter than the FP electrodes 12 of the electrode sets G1L.

The electrode sets G1S extend between a position closer to the upper edge TE than the center on the y axis of the first region R1, and the position of the boundary between the first region R1 and the second region R2. It should suffice if at least the FP electrodes 12 of the electrode sets G1S extend between the position closer to the upper edge TE than the center on the y axis of the first region R1, and the position of the boundary between the first region R1 and the second region R2. The gate electrodes 11 of the electrode sets G1S may be, at one or both ends thereof, shorter than the FP electrodes 12 of the electrode set G1S.

Lower ends of the electrode sets G1L and G1S are located, for example, at the same coordinate on the y axis.

The electrode sets G2 extend along the x axis between a position very close to the left edge LE and a position very close to the right edge RE. It should suffice if at least the FP electrode 12 of an electrode set G2 extends between the position very close to the left edge LE and the position very close to the right edge RE. The gate electrodes 11 of the electrode set G2 may be, at one or both ends thereof, shorter than the FP electrode 12 of the electrode set G2. In addition, the electrode sets G2 are arranged along the y axis over the entire area from the boundary between the first region R1 and second region R2 to the lower edge BE.

Each gate electrode 11 is connected to the gate pad 21 via a contact 14. Each FP electrode 12 is connected to a source pad 22 via a contact 15. The shape of the gate pad 21 and the shape of the FP electrode, as well as the positions of the contacts 14 and 15, will be described later in detail.

As illustrated in FIG. 1 and FIG. 2, in particular, in FIG. 2, the semiconductor device 1 includes the gate pad 21 and source pad 22. The gate pad 21 and source pad 22 spread in the xy plane, are apart from each other, are not in contact with each other, and are electrically insulated from each other. For example, an insulator is provided between the gate pad 21 and source pad 22.

The gate pad 21 is desired to have a shape and arrangement as to cross all gate electrodes 11 and all FP electrodes 12 at positions of two ends of each of all gate electrodes 11 and all FP electrodes 12. An example of the gate pad 21 which realizes such a shape will be described below.

The gate pad 21 includes a first portion 21a, a second portion 21b, a third portion 21c, a fourth portion 21d, a fifth portion 21e, a sixth portion 12f, and a seventh portion 21g.

The first portion 21a has a shape, for example, of a quadrangle and is located at an upper right corner of the semiconductor device 1. An upper side of the first portion 21a extends along the upper edge TE of the semiconductor device 1. A right side of the first portion 21a extends along the right edge RE of the semiconductor device 1, and is located, for example, on the right edge RE of the semiconductor device 1. A left side of the first portion 21a is located on an extension line of a boundary between a rightmost electrode set G1L and a leftmost electrode set G1S. A lower side of the first portion 21a faces an upper end of the electrode set G1S.

The second portion 21b has a shape, for example, of a quadrangle, extends along the upper edge TE of the semiconductor device 1, and is apart from the upper edge TE. A right side of the second portion 21b is connected to the left side of the first portion 21a. The second portion 21b is located slightly below the upper ends of the FP electrodes 12 of the electrode sets G1L. The second portion 21b extends across all electrode sets G1L. A left side of the second portion 21b is located, for example, at the left side of a right end of the leftmost gate electrode 11 of the electrode sets G1L.

The third portion 21c has a shape, for example, of a quadrangle and extends along the right edge RE of the semiconductor device 1. An upper side of the third portion 21c is connected to the lower side of the first portion 21a. A lower side of the third portion 21c is located slightly above the lower ends of the gate electrodes 11 and FP electrodes 12 of the electrode sets G1 (G1L and G1S).

The fourth portion 21d has a shape, for example, of a quadrangle and extends along the x axis. A right side of the fourth portion 21d is connected to the left side of the third portion 21c. The fourth portion 21d faces the lower side of the first portion 21a. The fourth portion 21d extends across all electrode sets G1S. A left side of the fourth portion 21d is located, for example, on the extension line of the boundary between the rightmost electrode set G1L and the leftmost electrode set G1S.

The fifth portion 21e has a shape, for example, of a quadrangle and extends along the x axis. A right side of the fifth portion 21e is connected to the left side of the third portion 21c. The fifth portion 21e is located slightly above the lower ends of the FP electrodes 12 of the electrode sets G1 (G1L and G1S). A left side of the fifth portion 21e is located, for example, between the leftmost gate electrode 11 and the left edge LE of the semiconductor device 1, and is located slightly to the right with respect to a left ends of the gate electrodes 11 and FP electrodes 12 of the electrode set G2.

The sixth portion 21f has a shape, for example, of a quadrangle, extends along the right edge RE of the semiconductor device 1, and is apart from the right edge RE. An upper side of the sixth portion 21f is connected to the lower side of the third portion 21c. The sixth portion 21f is located slightly to the left with respect to right ends of the FP electrodes 12 of the electrode sets G2. The sixth portion 21f extends across all electrode sets G2. A lower side of the sixth portion 21f is located at the lower side of an upper end of the lowermost gate electrode 11 of the electrode sets G2.

The seventh portion 21g has a shape, for example, of a quadrangle shape, extends along the left edge LE of the semiconductor device 1, and is apart from the left edge LE. An upper side of the seventh portion 21g is connected to the lower side of the fifth portion 21e. The seventh portion 21g is located slightly to the right with respect to left ends of the FP electrodes 12 of the electrode sets G2. The seventh portion 21g extends across all electrode sets G2. A lower side of the seventh portion 21g is located at the lower side of an upper end of the lowermost gate electrode 11 of the electrode sets G2.

The source pad 22 has, for example, such a pattern as to cover an area not covered by the gate pad 21 in the area along the xy plane of the semiconductor device 1, excluding areas of distances from the gate pad 21 at boundaries with the gate pad 21, and excluding areas of distances from the upper edge TE, lower edge BE, right edge RE and left edge LE of the semiconductor device 1. An example of the source pad 22 with such a shape will be described below.

The source pad 22 includes a first portion 22a, a second portion 22b, a third portion 22c, a fourth portion 22d, a fifth portion 22e, a sixth portion 22f, a seventh portion 22g, an eighth portion 22h, and a ninth portion 22i.

The first portion 22a has a shape, for example, of a quadrangle, and extends along the upper edge TE of the semiconductor device 1. The first portion 22a is located between the upper edge TE of the semiconductor device 1 and the first portion 21a of the gate pad 21. A right side of the first portion 22a faces, for example, the left side of the first portion 21a of the gate pad 21, and a lower side of the first portion 22a faces, for example, the upper side of the second portion 21b of the gate pad 21. A left side of the first portion 22a is located at a position closer to the left edge LE of the semiconductor device 1, than the left side of the second portion 21b of the gate pad 21, and the left side of the first portion 22a faces, for example, the left edge LE of the semiconductor device 1. The first portion 22a overlaps the upper ends of the FP electrodes 12 of all electrode sets G1L, and may also overlap the upper ends of the gate electrodes 11 of all electrode sets G1L.

The second portion 22b has a shape, for example, of a quadrangle, and is located between the left side of the second portion 21b of the gate pad 21 and the left edge LE of the semiconductor device 1. An upper side of the second portion 22b is connected to the lower side of the first portion 22a of the source pad 22. A left side of the second portion 22b faces, for example, the left edge LE of the semiconductor device 1.

The third portion 22c has a shape, for example, of a quadrangle and spreads between the second portion 21b and fifth portion 21e of the gate pad 21. A left side of the third portion 22c extends along the left side LE of the semiconductor device 1, and faces, for example, the left edge LE of the semiconductor device 1. An upper side of the third portion 22c is connected to, for example, a lower side of the second portion 22b. A right side of the third portion 22c faces, partly, the left side of the first portion 21a of the gate pad 21, and an upper side of the third portion 22c faces the second portion 21b of the gate pad 21. The third portion 22c overlaps all electrode sets G1L.

The fourth portion 22d has a shape, for example, of a quadrangle and is located in an area surrounded by the third portion 22c, and the first portion 21a, third portion 21c and fourth portion 21d of the gate pad 21. An upper side, right side and lower side of the fourth portion 22d face the first portion 21a, third portion 21c and fourth portion 21d of the gate pad 21, respectively. A left side of the fourth portion 22d is connected to the right side of the third portion 22c. The fourth portion 22d overlaps the upper ends of the FP electrodes 12 of all electrode sets G1S, and may also overlap the upper ends of the gate electrodes 11 of all electrode sets G1S.

The fifth portion 22e has a shape, for example, of a quadrangle and is located in an area surrounded by the third portion 22c, and the third portion 21c, fourth portion 21d and fifth portion 21e of the gate pad 21. An upper side, right side and lower side of the fifth portion 22e face the fourth portion 21d, third portion 21c and fifth portion 21e of the gate pad 21, respectively. A left side of the fifth portion 22e is connected to the right side of the third portion 22c. The fifth portion 22e overlaps all electrode sets G1S.

The sixth portion 22f has a shape, for example, of a quadrangle and is located in an area surrounded by the third portion 22c, the seventh portion 21g of the gate pad 21, and the left edge LE and lower edge BE of the semiconductor device 1. A left side of the sixth portion 22f faces, for example, the left edge LE of the semiconductor device 1. An upper side of the sixth portion 22f is connected to the lower side of the third portion 22c. A right side of the sixth portion 22f faces the seventh portion 21g of the gate pad 21. The sixth portion 22f overlaps the left ends of the FP electrodes 12 of all electrode sets G2, and may also overlap the left ends of the gate electrodes 11 of all electrode sets G2.

The seventh portion 22g has a shape, for example, of a quadrangle, extends along the lower edge BE of the semiconductor device 1, and extends between the left edge LE and right edge RE of the semiconductor device 1. A lower side, left side and right side of the seventh portion 22g face, for example, the lower edge BE, left edge LE and right edge RE of the semiconductor device 1. An upper side of the seventh portion 22g is partly connected to the lower side of the sixth portion 22f, and partly faces the lower side of the sixth portion 21f and the lower side of the seventh portion 21g of the gate pad 21.

The eighth portion 22h has a shape, for example, of a quadrangle and is located in an area surrounded by the seventh portion 22g, and the fifth portion 21e, sixth portion 21f and seventh portion 21g of the gate pad 21. A lower side of the eighth portion 22h is connected to the upper side of the seventh portion 22g. An upper side, right side and left side of the eighth portion 22h face the fifth portion 21e, sixth portion 21f and seventh portion 21g of the gate pad 21. The eighth portion 22h overlaps all electrode sets G2. In addition, the eighth portion 22h overlaps the lower ends of the FP electrodes 12 of all electrode sets G1, and may also overlap the lower ends of the gate electrodes 11 of all electrode sets G1.

The ninth portion 22i has a shape, for example, of a quadrangle and is located in an area surrounded by the seventh portion 22g, the third portion 21c and sixth portion 21f of the gate pad 21, and the right edge RE of the semiconductor device 1. A right side of the ninth portion 22i faces, for example, the right edge RE of the semiconductor device 1. An upper side and left side of the ninth portion 22i face the lower side of the third portion 21c and the right side of the sixth portion 21f of the gate pad 21. A lower side of the ninth portion 22i is connected to the upper side of the seventh portion 22g. The ninth portion 22i overlaps the right ends of the FP electrodes 12 of all electrode sets G2, and may also overlap the right ends of the gate electrodes 11 of all electrode sets G2.

Each contact 14 is located at a position where the gate pad 21 and one gate electrode 11 intersect, and connects the gate pad 21 and this gate electrode 11. Each gate electrode 11 overlaps parts of the gate pad 21 at two locations of both ends thereof, and is connected to the gate pad 21 via the contacts 14 at the two locations.

Each contact 15 is located at a position where the source pad 22 and one FP electrode 12 intersect, and connects the source pad 22 and this FP electrode 12. Both ends of each FP electrode 12 are located outside the gate pad 21, and each FP electrode 12 is connected to the source pad 22 via the contacts 15 at two locations of both ends thereof, on the outside of the gate pad 21.

The gate pad 21 has the pattern and shape as described above. Thus, a signal which is applied to the gate pad 21 reaches ends of the gate pad 21 through a paths which are described below. The first portion 21a receives a signal which is supplied, for example, from the outside of the semiconductor device 1. The received signal travels to the left in the second portion 21b, and reaches the left side of the second portion 21b. In this process, the signal passes through the positions of the upper-side contacts 14 of the gate electrodes 11 of all electrode sets G1L. The received signal reaches the left side of the fourth portion 21d, and, in this process, the signal passes through the positions of the upper-side contacts 14 of the gate electrodes 11 of all electrode sets G1S. The received signal travels downward in the third portion 21c and sixth portion 21f, and reaches the lower side of the sixth portion 21f. In this process, the signal passes through the positions of the right-side contacts 14 of the gate electrodes 11 of all electrode sets G2.

The signal received by the first portion 21a also travels downward in the third portion 21c, travels to the left in the fifth portion 21e, reaches the left side of the fifth portion 21e, travels downward in the seventh portion 21g, and reaches the lower side of the seventh portion 21g. In this process, the signal passes through the positions of the lower-side contacts 14 of the gate electrodes 11 of all electrode sets G1, and passes through the positions of the left-side contacts 14 of the gate electrodes 11 of all electrode sets G2.

Figure 3:
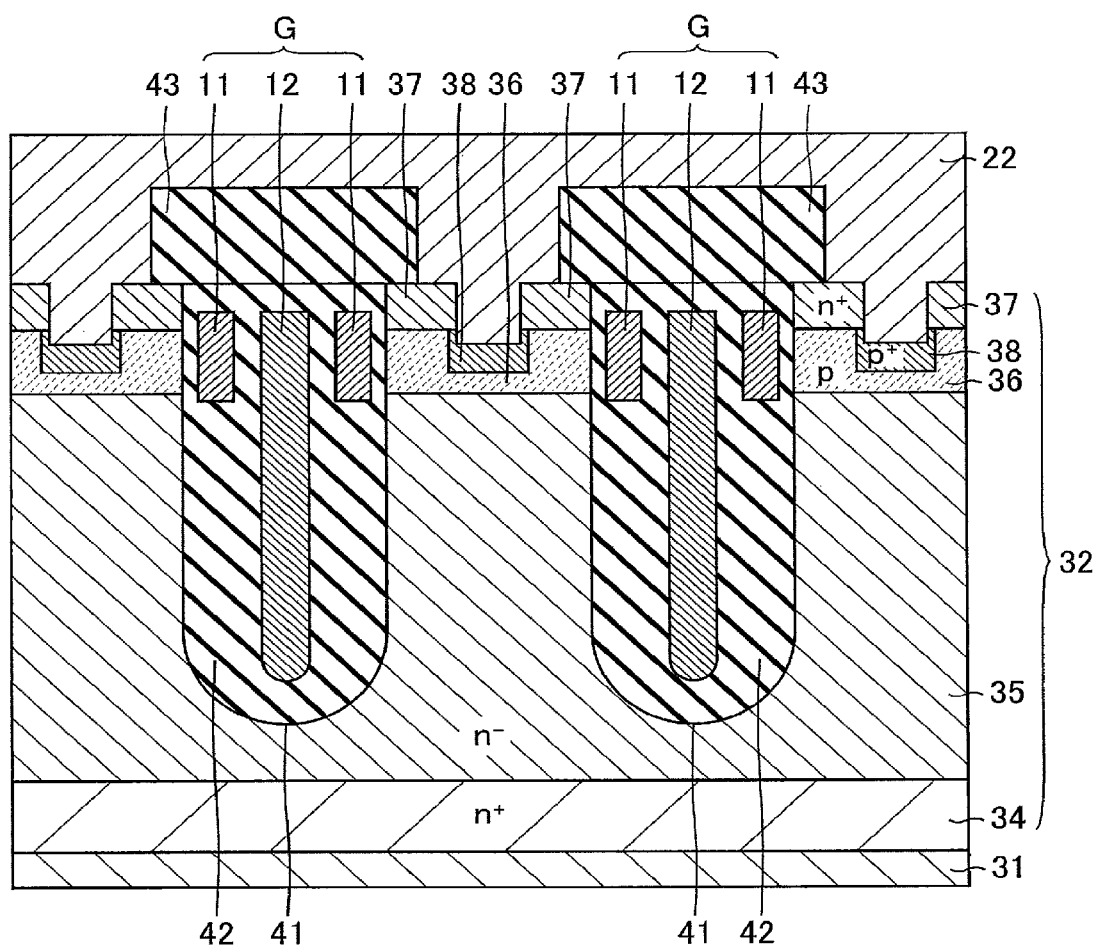
FIG. 3 illustrates a cross-sectional structure of a part of the semiconductor device of the first embodiment.

FIG. 3 illustrates a cross-sectional structure of a part of the semiconductor device 1 of the first embodiment, and illustrates a cross section taken along line III-III in FIG. 1 and FIG. 2.

As illustrated in FIG. 3, a semiconductor 32 is provided on a top surface of a drain electrode 31. The semiconductor 32 includes a silicon substrate and an epitaxial layer of silicon. The semiconductor 32 includes an $n^+$-type drain region 34, an $n^-$-type drift region 35, a p-type base region 36, an $n^+$-type source region 37, and a $p^+$-type contact region 38. Superscripts "+" and "−" of "n" or "p", which is indicative of a conductivity type, represent a relative carrier concentration. For example, an $n^-$-type region, an n-type region and an $n^+$-type region have carrier concentrations which increase in the named order. When a region having a carrier concentration includes both n-type impurities and p-type impurities, this carrier concentration is indicative of the concentration of n-type impurities, which exclude n-type impurities that are canceled by the p-type impurities. The same applies to the p-type. A description relating to n-type impurities, in which "n" is replaced with "p", applies to a description relating to the p-type.

The $n^+$-type drain region 34 is located on the top surface of the drain electrode 31, and is located, for example, in a silicon substrate. Of the semiconductor 32, the parts other than the $n^+$-type drain region 34 are, for example, epitaxial layers.

The semiconductor 32 has such a shape that portions thereof are removed from the top surface by trenches 41. A bottom of the trench 41 is located in the $n^-$-type drift region 35, and is not in contact with the $n^+$-type drain region 34. Each trench 41 includes one electrode set G, as will be described later in detail. Thus, the trenches 41 have such shapes and dispositions that the electrode sets G are arranged as described with reference to FIG. 1 and FIG. 2. The trenches 41 including the electrode sets G1 (G1L and G1S) are, in the xy plane, located in the first region R1, extend along the y axis, and are arranged along the x axis, like the electrode sets G1. The trenches 41 including the electrode sets G2 are, in the xy plane, located in the second region R2, extend along the x axis, and are arranged along the y axis, like the electrode sets G2.

In each trench 41, two gate electrodes 11 and one FP electrode 12 are provided. The FP electrode 12 is located at or near the center of the trench 41, and extends along the z axis from a position lower than the position of the opening (the top surface of the semiconductor 32) of the trench 41 up to a position higher than the bottom of the trench 41.

In each trench 41, the two gate electrodes 11 are located on both sides of the FP electrode 12. One gate electrode 11 is located between the FP electrode 12 and a left-side edge of the trench 41. The other gate electrode 11 is located between the FP electrode 12 and a right-side edge of the trench 41. The FP electrode 12 extends along the z axis between a position lower than the position of the opening (the top surface of the semiconductor 32) of the trench 41 and a position of a vicinity of the top surface of the $n^-$-type drift region 35.

An insulator 42 is provided in the trench 41 in an area which excludes the FP electrode 12 AND gate electrodes 11. Specifically, a portion of the insulator 42 is located between the FP electrode 12 and the $n^-$-type drift region 35. Another portion of the insulator 42 is located in an area between the FP electrode 12 and each gate electrode 11. In addition, a portion of the insulator 42 is located between each gate electrode 11 and the p-type base region 36. Further, a top surface of the FP electrode 12 and top surfaces of the gate electrodes 11 are covered with a portion of the insulator 42.

Each p-type base region 36 is located between two electrode sets G. Specifically, each p-type base region 36 is located between the right-side gate electrode 11 in the left-side electrode set G and the left-side gate electrode 11 in the right-side electrode set G. The p-type base region 36 is, at a bottom surface thereof, in contact with a top surface of the $n^-$-type drift region 35. The p-type base region 36 faces, at a left end thereof, the right-side gate electrode 11 in the left-side electrode set G via a portion of the insulator 42, and faces, at a right end thereof, the left-side gate electrode 11 in the right-side electrode set G via a portion of the insulator 42. The p-type base regions 36 extend along the x axis or y axis along the neighboring trenches 41.

Two $n^+$-type source regions 37 are located, spaced apart from each other, on the upper side of each p-type base region 36. Bottoms of the $n^+$-type source regions 37 are in contact with the p-type base region 36. The left-side $n^+$-type source region 37 faces, at a left end thereof, the right-side gate electrode 11 in the left-side electrode set G via a portion of the insulator 42. The right-side $n^+$-type source region 37 faces, at a right end thereof, the left-side gate electrode 11 in the right-side electrode set G via a portion of the insulator 42. The $n^+$-type source regions 37 extend along the x axis or y axis along the neighboring trenches 41.

One $p^+$-type contact region 38 is located on the upper side of each p-type base region 36. A bottom of the $p^+$-type contact region 38 is, at a lower part and side parts thereof, in contact with one corresponding p-type base region 36, and is located, for example, at a position lower than a boundary between the p-type base region 36 and the corresponding $n^+$-type source regions 37.

An insulator 43 is located on a top surface of the insulator 42 in each trench 41. Mutually neighboring insulators 43 are apart above the $p^+$-type contact region 38.

The source pad 22 includes a part located on top surfaces of the insulators 43, and parts each between the mutually neighboring insulators 43. The source pad 22 is in contact with the $p^+$-type contact region 38 in each area between mutually neighboring insulators 43.

Figure 4:
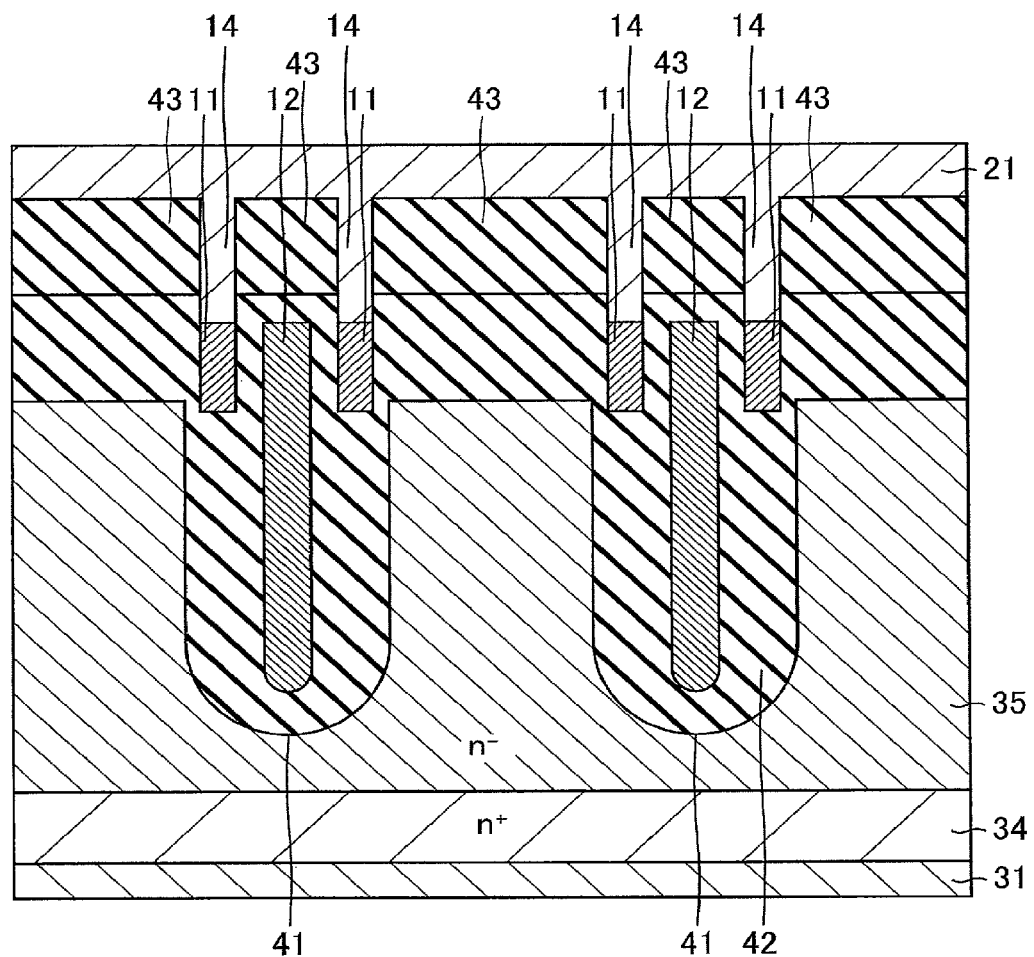
FIG. 4 illustrates a cross-sectional structure of a part of the semiconductor device of the first embodiment.

FIG. 4 illustrates a cross-sectional structure of a part of the semiconductor device 1 of the first embodiment, and illustrates a cross section taken along line IV-IV in FIG. 1 and FIG. 2. As illustrated in FIG. 4, each contact 14 is located above the gate electrode 11 to which the contact 14 is connected. The insulators 42 and 43 are partly removed above the gate electrodes 11. In the parts where the insulators 42 and 43 are partly removed, the contacts 14 are, at top surfaces thereof, connected to the bottom surface of the gate pad 21, and are, at bottom surfaces thereof, connected to the top surfaces of the corresponding gate electrodes 11.

Figure 5:
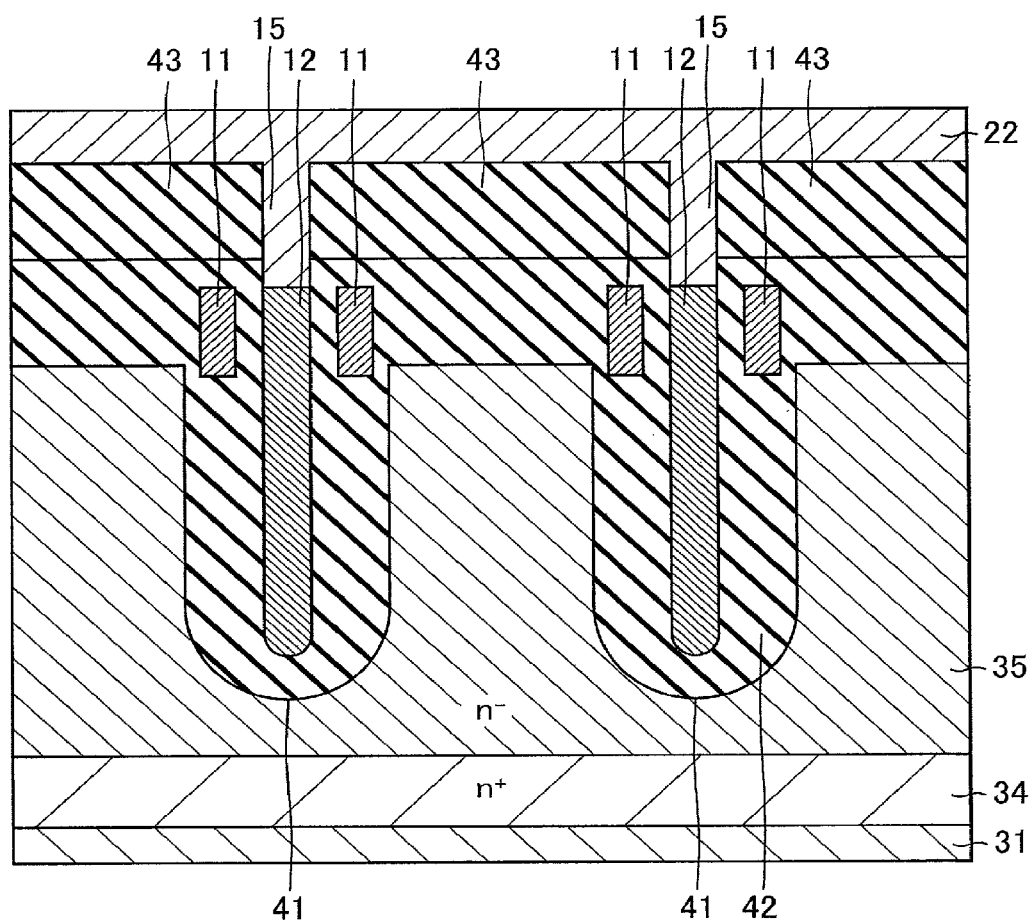
FIG. 5 illustrates a cross-sectional structure of a part of the semiconductor device of the first embodiment.

FIG. 5 illustrates a cross-sectional structure of a part of the semiconductor device 1 of the first embodiment, and illustrates a cross section taken along line V-V in FIG. 1 and FIG. 2. As illustrated in FIG. 5, each contact 15 is located above the FP electrode 12 to which the contact 15 is connected. The insulators 42 and 43 are partly removed above the FP electrodes 12. In the parts where the insulators 42 and 43 are partly removed, the contacts 15 are, at top surfaces thereof, connected to the bottom surface of the source pad 22, and are, at bottom surfaces thereof, connected to the top surfaces of the corresponding FP electrodes 12.

According to the first embodiment the semiconductor device 1, in which warpage is suppressed and the lengths of interconnects are short, can be realized, as will be described below.

The semiconductor device 1 includes the electrode sets G extending in two directions, in particular, in two orthogonal directions. This can prevent stress from concentrating in an identical direction as in a case where electrode sets G extend only in one direction, and suppress warpage of the chip of the semiconductor device 1.

In order to arrange the electrode sets G in two directions for the purpose of reduction in concentration of stress, it is conceivable to divide the plane of the semiconductor device 1 into two regions (e.g. the first region R1 and second region R2) as in the first embodiment, and to arrange the electrode sets G in a first direction in one region and arrange the electrode sets G in a second direction in the other region. Some shapes are conceivable for the gate pad 21 and source pad 22 which can be connected to the electrode sets G that are arranged as described above. The gate pad needs to be disposed so as to overlap all electrode sets G at both ends of the electrode sets G, and the source pad needs to be spread over areas free from the gate pad.

FIG. 6 illustrates a plan-view structure of a semiconductor device 100 for a first reference, and illustrates a gate pad 110 and a source pad 120. The gate pad 110 corresponds to the gate pad 21 of the first embodiment, and the source pad 120 corresponds to the source pad 22 of the first embodiment.

The gate pad 110 includes a quadrangle portion 100a which is similar to the first portion 21a of the gate pad 21 of the first embodiment, and includes a pattern which surrounds the periphery of a first region R1 and the periphery of a second region R2. When the source pad 120 is to be disposed on the basis of the gate pad 110 with such a shape, the source pad 120 inevitably includes two independent portions, namely a portion surrounded by the pattern of the gate pad 110 in the first region R1, and the other portion. The source pad 120 cannot be disposed in a non-divided form.

Figure 7:
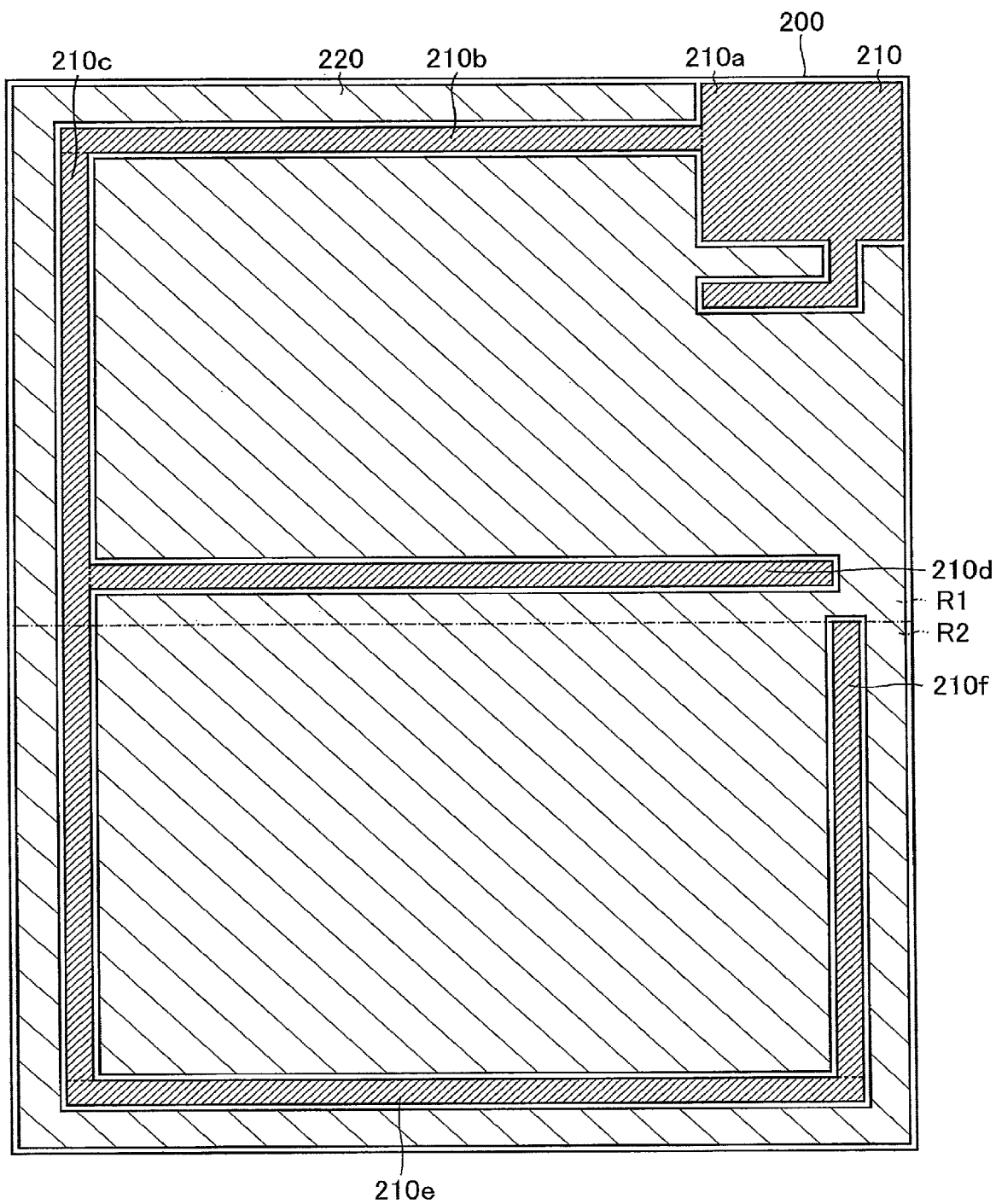
FIG. 7 illustrates a plan-view structure of a semiconductor device for a second reference.

FIG. 7 illustrates a plan-view structure of a semiconductor device 200 for a second reference, and illustrates a gate pad 210 and a source pad 220. The gate pad 210 includes a quadrangle first portion 210a which is similar to the first portion 21a of the gate pad 21 of the first embodiment, and also includes a second portion 210b extending along an upper edge of the semiconductor device 200, a third portion 210c extending along a left edge of the semiconductor device 200, a fourth portion 210d located at a boundary between the first region R1 and second region R2, a fifth portion 210e extending along the lower edge of the semiconductor device 200, and a sixth portion 210f extending along the right edge of the semiconductor device 200. The fourth portion 210d is located in the first region R1. The fourth portion 210d and sixth portion 210f are apart from each other. On the basis of the gate pad 210 with such a shape, the part of the source pad 220 in the first region R1 can be continuous with the part of the source pad 220 in the second region R2 via the part of the right side of the first region R1 and the area between the fourth portion 210d and sixth portion 210f of the source pad 210. Specifically, the source pad 220 can be disposed without being divided.

However, parts with long interconnects of the gate pad 210 are present, and the efficiency of transmission of signals to the fourth portion 210d and sixth portion 210f is low. A signal received at the first portion 210a travels to the left in the second portion 210b, travels downward in the third portion 210c, and travels to the right in the fourth portion 210d. Similarly, a signal received at the first portion 210a needs to travel to the left in the second portion 210b, travel downward in the third portion 210c, travel to the right in the fifth portion 210e, and travel upward in the sixth portion 210f. These paths require the signal to travel in a certain direction at a certain location and travel in the reverse direction at another location. Such signal transmission is inefficient.

The gate pad 21 of the semiconductor device 1 of the first embodiment includes the second portion 21b, third portion 21c, fourth portion 21d, fifth portion 21e, sixth portion 12f, and seventh portion 21g. The second portion 21b overlaps the upper-side portions of all electrode sets G1L, and is connected to the first portion 21a at only the right side and is not connected to other part of the gate pad 21 at the left side. The fourth portion 21d overlaps the upper-side portions of all electrode sets G1S. The fifth portion 21e overlaps the lower-side portions of all electrode sets G1, and is connected to the third portion 21c at the right side and not connected to the second portion 21b. The sixth portion 21f overlaps the right-side portions of all electrode sets G2, and is connected to the third portion 21c at the upper side, and not connected to other part of the gate pad 21 at the lower side. The seventh portion 21g overlaps the left-side portions of all electrode sets G2, and is connected to the fifth portion 21e at the upper side, and not connected to other part of the gate pad 21 at the lower side.

With the gate pad 21 of such a shape, the signal received at the first portion 21a can reach a terminal of each portion without need to travel in a certain direction and then travel back in the opposite direction. Thus, the signal received at the first portion 21a can efficiently reach all contacts 14. Furthermore, since there is no area which is completely surrounded by the gate pad 21, the continuous source pad 22, which covers the entire area other than the area where the gate pad 21 is provided, can be provided.

The above description relates to the example in which the first portion 21a of the gate pad 21 is located on the right side on the xy plane. The first embodiment is not limited to this example. For example, the semiconductor device 1 may include a structure of mirror-image of the described structure with respect to the y axis. In this case, the first portion 21a of the gate pad 21 is located at the upper left of the semiconductor device 1. Shapes and arrangements of other elements can be known by analogy, and are not described in detail.

Second Embodiment

A semiconductor device 1 of a second embodiment differs from the first embodiment in the directions of extension of electrode sets G. Based on this, the semiconductor device 1 of the second embodiment differs from the first embodiment in the shapes of the gate pad 21 and source pad 22. For distinction from the first embodiment, the semiconductor device 1 of the second embodiment is referred to as "semiconductor device 1A". Different points from the first embodiment will mainly be described below.

Figure 8:
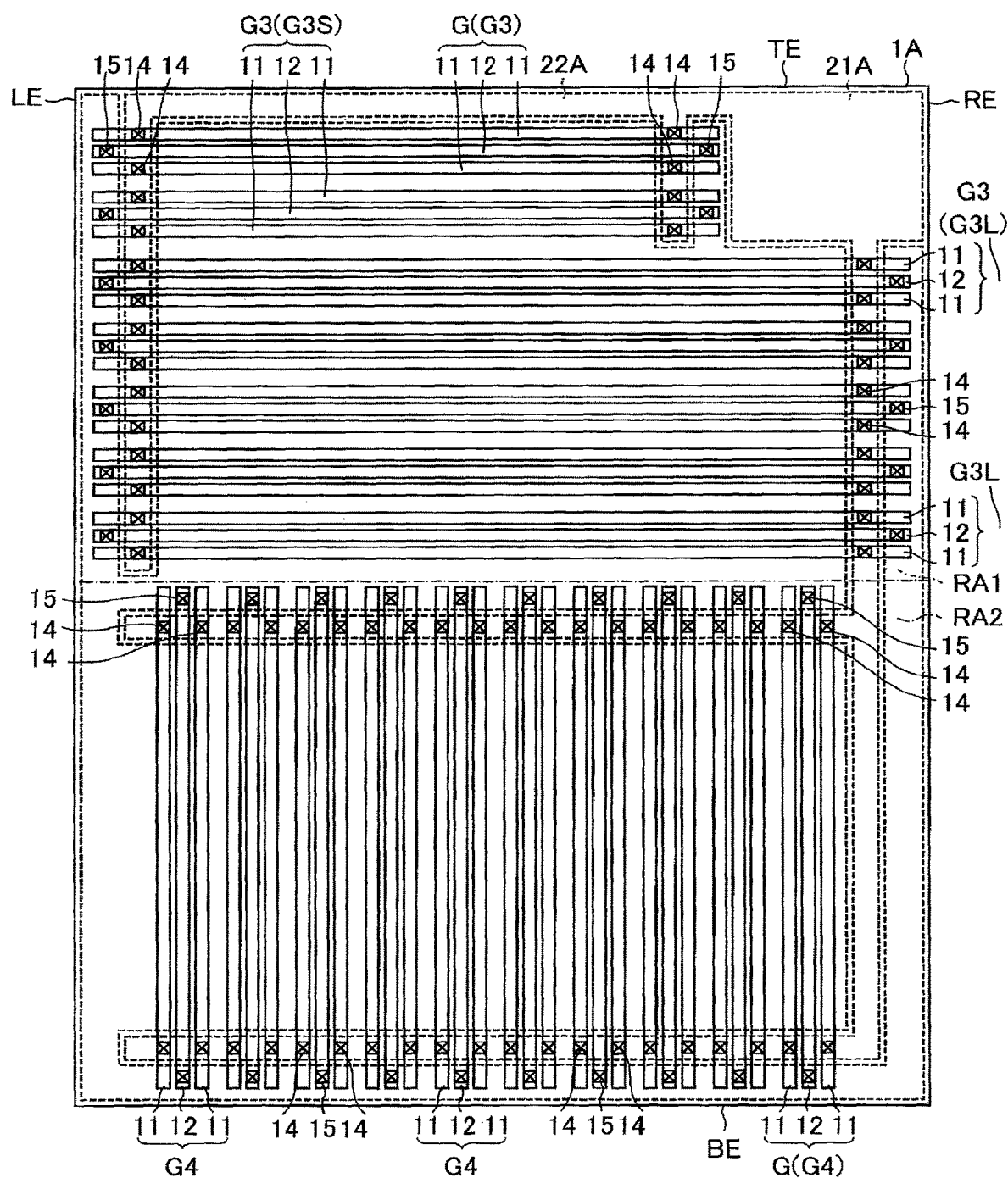
FIG. 8 illustrates a plan-view structure of a semiconductor device of a second embodiment.
Figure 8:
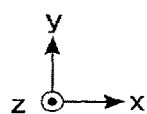
Figure 9:
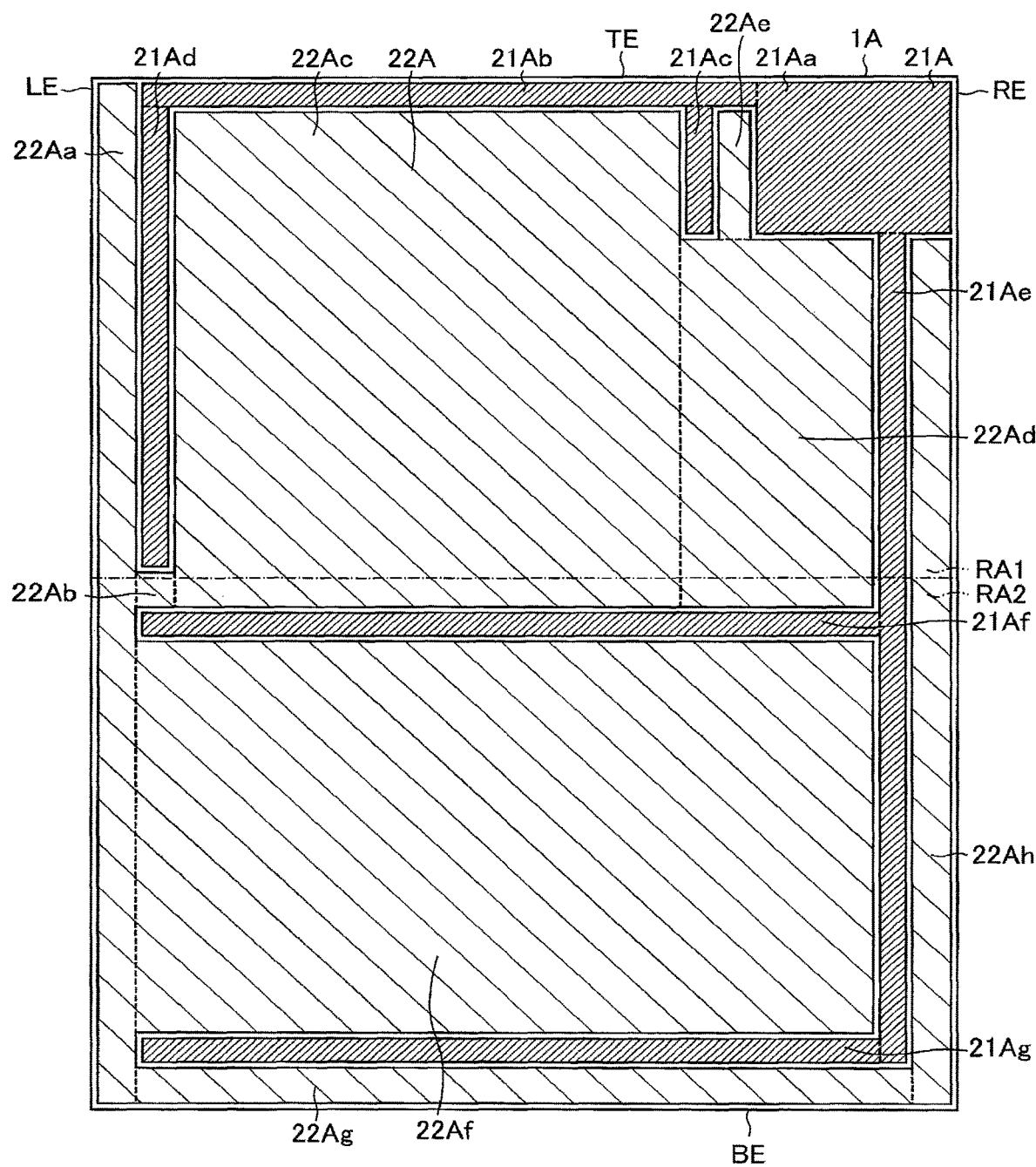
FIG. 9 illustrates a plan-view structure of the semiconductor device of the second embodiment.

FIG. 8 and FIG. 9 illustrate structures along an xy plane of the semiconductor device 1A of the second embodiment. FIG. 8 and FIG. 9 illustrate structures at different coordinates on the z axis. FIG. 9 illustrates a structure at a z-axis coordinate greater than the z-axis coordinate at which the structure is shown in FIG. 9.

As illustrated in FIG. 8, the electrode sets G include electrode sets G3 in the first region R1, and electrode sets G4 in the second region R2. The electrode sets G3 extend along the x axis, and are arranged over the entire area from the upper edge TE to the boundary between the first region R1 and second region R2. The electrode sets G3 are composed of electrode sets G3L and G3S. The electrode sets G3L are longer than the electrode sets G3S. Specifically, the gate electrodes 11 and FP electrode 12 in the electrode sets G3L are longer than the gate electrodes 11 and FP electrode 12 in the electrode sets G3S.

The electrode sets G3S are located in the upper-side part of the first region R1, among all electrode sets G3 in the first region R1, and the electrode sets G3L are located in the lower-side portion of the first region R1 in the first region R1. A boundary between the electrode sets G3S and G3L agrees with, for example, an extension line of an edge of a first portion 21a (to be described later) of a gate pad 21A. The electrode sets G3S extend between a position very close to the left edge LE, and a position closer to the right edge RE than the center on the x axis of the first region R1. It should suffice if at least the FP electrode 12 of the electrode set G3S extends between the position very close to the left edge LE and the position closer to the right edge RE than the center on the x axis of the first region R1. The gate electrodes 11 of an electrode set G3S may be, at one or both ends thereof, shorter than the FP electrode 12 of the electrode set G3S.

The electrode sets G3L extend between a position very close to the left edge LE and a position very close to the right edge RE. It should suffice if at least the FP electrodes 12 of the electrode sets G3L extend between the position very close to the left edge LE and the position very close to the right edge RE. The gate electrodes 11 of the electrode sets G3L may be, at one or both ends thereof, shorter than the FP electrodes 12 of the electrode sets G3L.

The left ends of the FP electrodes 12 of the electrode sets G3L and G3S are located, for example, at the same coordinate on the x axis. The left ends of the gate electrodes 11 and FP electrodes 12 of the electrode sets G3L and G3S may be located at the same coordinate on the x axis.

The electrode sets G4 extend along the y axis between the position of the boundary between the first region R1 and second region R2, and a position very close to the lower edge BE. It should suffice if at least the FP electrodes 12 of the electrode sets G4 extend between the position of the boundary between the first region R1 and second region R2 and the position very close to the lower edge BE. The gate electrodes 11 of the electrode sets G4 may be, at one or both ends thereof, shorter than the FP electrodes 12 of the electrode sets G4. Further, the electrode sets G4 are arranged along the x axis over the entire area from the left edge LE to right edge RE.

As illustrated in FIG. 8 and FIG. 9, in particular, in FIG. 9, the semiconductor device 1A includes a gate pad 21 and a source pad 22. The gate pad 21 and source pad 22 of the second embodiment may be referred to as "gate pad 21A" and "source pad 22A", respectively, to be distinguished from those in the first embodiment.

The gate pad 21A includes a first portion 21Aa, a second portion 21Ab, a third portion 21Ac, a fourth portion 21Ad, a fifth portion 21Ae, a sixth portion 12Af, and a seventh portion 21Ag.

The first portion 21Aa is substantially the same as the first portion 21a of the gate pad 21 of the first embodiment. The first portion 21Aa has a shape, for example, of a quadrangle and is located at an upper right corner of the semiconductor device 1A. An upper side of the first portion 21Aa faces, for example, the upper edge TE of the semiconductor device 1A. A right side of the first portion 21Aa faces, for example, the right edge RE of the semiconductor device 1A. A left side of the first portion 21Aa faces right ends of the FP electrodes 12 of the electrode sets G3S, and may also face the right ends of the gate electrodes 11 of the electrode sets G3S. A lower side of the first portion 21Aa is located on an extension line of the boundary between the electrode sets G3S and G3L.

The second portion 21Ab has a shape, for example, of a quadrangle, and extends along the upper edge TE of the semiconductor device 1A. An upper side of the second portion 21Ab faces, for example, the upper edge TE of the semiconductor device 1A. A right side of the second portion 21Ab is connected to the left side of the first portion 21Aa. A left side of the second portion 21Ab is located slightly to the right with respect to the left ends of the gate electrodes 11 and FP electrodes 12 of the electrode sets G3.

The third portion 21Ac has a shape, for example, of a quadrangle and extends along the y axis. An upper side of the third portion 21Ac is connected to a lower side of the second portion 21Ab. A right side of the third portion 21Ac faces, for example, the left side of the first portion 21Aa. The third portion 21Ac overlaps right-side portions of all electrode sets G3S. A lower side of the third portion 21Ac is located, for example, on an extension line of the boundary between the lowermost electrode set G3S and the uppermost electrode set G3L.

The fourth portion 21Ad has a shape, for example, of a quadrangle, extends along the left edge LE of the semiconductor device 1A, and is apart from the left edge LE. An upper side of the fourth portion 21Ad is connected to the lower side of the second portion 21Ab. The fourth portion 21Ad is located slightly to the right with respect to left ends of the FP electrodes 12 of the electrode sets G3 (G3S and G3L). The fourth portion 21Ad extends across all electrode sets G3. A lower side of the fourth portion 21Ad is located in an area at the lower side of an upper end of the lowermost gate electrode 11 of the electrode sets G3L.

The fifth portion 21Ae has a shape, for example, of a quadrangle, extends along the right edge RE of the semiconductor device 1A, and is apart from the right edge RE. An upper side of the fifth portion 21Ae is connected to the lower side of the first portion 21Aa. The fifth portion 21Ae is located slightly to the left with respect to the right ends of the FP electrodes 12 of the electrode sets G3L. The fifth portion 21Ae extends across all electrode sets G3L. A lower side of the fifth portion 21Ae is located slightly above the lower ends of the FP electrodes 12 of the electrode set G4.

The sixth portion 21Af has a shape, for example, of a quadrangle and extends along the x axis. A right side of the sixth portion 21Af is connected to the left side of the fifth portion 21Ae. The sixth portion 21Af is located slightly below the upper ends of the FP electrodes 12 of the electrode sets G4. The sixth portion 21Af extends across all electrode sets G4. A left side of the sixth portion 21Af is located, for example, to the left with respect to a right side of the leftmost gate electrode 11 of the electrode set G4.

The seventh portion 21Ag has a shape, for example, of a quadrangle and extends along the x axis. A right side of the seventh portion 21Ag is connected to the left side of the fifth portion 21Ae. The seventh portion 21Ag is located slightly above the lower side of each of the FP electrodes 12 of the electrode sets G4. The seventh portion 21Ag extends across all electrode sets G4. A left side of the seventh portion 21Ag is located, for example, at the left side of the right end of the leftmost gate electrode 11 of the electrode set G4.

The source pad 22A has, for example, such a pattern as to cover an area not covered by the gate pad 21A, in the area along the xy plane of the semiconductor device 1A, excluding areas of distances from the gate pad 21A at boundaries with the gate pad 21A, and excluding areas of distances from the upper edge TE, lower edge BE, right edge RE and left edge LE of the semiconductor device 1A. An example of the source pad 22A with such a shape will be described.

The source pad 22A includes a first portion 22Aa, a second portion 22Ab, a third portion 22Ac, a fourth portion 22Ad, a fifth portion 22Ae, a sixth portion 22Af, a seventh portion 22Ag, and an eighth portion 22Ah.

The first portion 22Aa has a shape, for example, of a quadrangle, is located between the left edge LE of the semiconductor device 1A and the fourth portion 21Ad of the gate pad 21A, and extends between the upper edge TE and lower edge BE of the semiconductor device 1A. A left side of the first portion 22Aa faces, for example, the left edge LE of the semiconductor device 1A. The first portion 22Aa overlaps, for example, the left ends of the FP electrodes 12 of all electrode sets G3, and may also overlap the left ends of the gate electrodes 11 of all electrode sets G3.

The second portion 22Ab has a shape, for example, of a quadrangle and is located between the lower side of the fourth portion 21Ad of the gate pad 21A and the sixth portion 21f of the gate pad 21A. A left side of the second portion 22Ab is connected to the right side of the first portion 22Aa.

The third portion 22Ac has a shape, for example, of a quadrangle, and is located at the left side of the third portion 21Ac, in the area surrounded by the second portion 21Ab, fourth portion 21Ad and sixth portion 21Af of the gate pad 21A. A part of the left side of the third portion 22Ac is connected to the right side of the second portion 22Ab. The third portion 22Ac overlaps all electrode sets G3, and also overlaps the upper ends of the gate electrodes 11 and FP electrodes 12 of all electrode sets G4 on the left side of the third portion 21Ac of the gate pad 21A.

The fourth portion 22Ad has a shape, for example, of a quadrangle, and is located in an area surrounded by the first portion 21Aa, third portion 21Ac, fifth portion 21Ae and sixth portion 21Af of the gate pad 21A. A left side of the fourth portion 22Ad is connected to the right side of the third portion 22Ac. The fourth portion 22Ad overlaps all electrode sets G3L, and also overlaps the upper ends of the gate electrodes 11 and FP electrodes 12 of all electrode sets G4 on the right side of the right side of the third portion 21Ac of the gate pad 21A.

The fifth portion 22Ae has a shape, for example, of a quadrangle, and is located between the first portion 21Aa and third portion 21Ac of the gate pad 21A. A lower side of the fifth portion 22Ae is connected to the upper side of the fourth portion 22Ad. The fifth portion 22Ae overlaps the right ends of the FP electrodes 12 of all electrode sets G1S, and may also overlap the right sides of the gate electrodes 11 of all electrode sets G1S.

The sixth portion 22Af has a shape, for example, of a quadrangle, and is located in an area surrounded by the fifth portion 21Ae, sixth portion 21Af and seventh portion 21Ag of the gate pad 21A. A left side of the sixth portion 22Af is connected to the right side of the first portion 22Aa. The sixth portion 22Af overlaps all electrode sets G4.

The seventh portion 22Ag has a shape, for example, of a quadrangle, and is located in an area between the seventh portion 21Ag of the gate pad 21A and the lower edge BE of the semiconductor device 1A. A left side of the seventh portion 22Ag is connected to the right side of the first portion 22Aa. A lower side of the seventh portion 22Ag face, for example, the lower edge BE of the semiconductor device 1A. The seventh portion 22Ag overlaps the lower ends of the FP electrodes 12 of all electrode sets G4, and may also overlap the lower ends of the gate electrodes 11 of all electrode sets G4.

The eighth portion 22Ah has a shape, for example, of a quadrangle, and is located in an area surrounded by the first portion 21Aa and fifth portion 21Ae of the gate pad 21A, and the right edge RE and lower edge BE of the semiconductor device 1A. A part of the left side of the eighth portion 22Ah is connected to the right side of the seventh portion 22Ag. A right side and a lower side of the eighth portion 22Ah face, for example, the right edge RE and lower edge BE of the semiconductor device 1A. The eighth portion 22Ah overlaps the right ends of the FP electrodes 12 of all electrode sets G3L, and may also overlap the right ends of the gate electrodes 11 of all electrode sets G3L.

The gate pad 21A has the pattern and shape as described above. Thus, a signal which is applied to the gate pad 21A reaches ends of the gate pad 21A through paths which are described below. The first portion 21Aa receives a signal which is supplied, for example, from the outside of the semiconductor device 1A. The received signal travels to the left in the second portion 21Ab, travels downward in the third portion 21Ac, and reaches the lower side of the third portion 21Ac. In this process, the signal passes through the positions of the right-side contacts 14 of the gate electrodes 11 of all electrode sets G3S. In addition, the received signal reaches the lower side of the fourth portion 21Ad via the second portion 21Ab. In this process, the signal passes through the positions of the left-side contacts 14 of the gate electrodes 11 of all electrode sets G3.

In addition, the signal received at the first portion 21Aa reaches the lower side of the fifth portion 21Ae, and, in this process, the signal passes through the positions of the right-side contacts 14 of the gate electrodes 11 of all electrode sets G3L. Further, the signal reaches the left side of the sixth portion 21Af, and, in this process, the signal passes through the positions of the upper-side contacts 14 of the gate electrodes 11 of all electrode sets G4. The signal further reaches the left side of the seventh portion 21Ag, and, in this process, the signal passes through the positions of the lower-side contacts 14 of the gate electrodes 11 of all electrode sets G4.

The cross-sectional structure of the semiconductor device 1A is the same as the cross-sectional structure (see, FIG. 3, FIG. 4 and FIG. 5) of the semiconductor device 1 of the first embodiment.

The gate pad 21A of the semiconductor device 1A of the second embodiment includes the third portion 21Ac, fourth portion 21Ad, fifth portion 21Ae, sixth portion 21Af and seventh portion 21Ag. The third portion 21Ac overlaps the right-side portions of all electrode sets G3S, and is connected to the second portion 21Ab at only the upper side thereof. The fourth portion 21Ad overlaps the left-side portions of all electrode sets G3, is connected to the second portion 21Ab at only the upper side thereof, and is not connected to other part of the gate pad 21A at the lower side thereof. The fifth portion 21Ae overlaps the right-side portions of all electrode sets G3L. The sixth portion 21Af overlaps the upper-side portions of all electrode sets G4, is connected to the fifth portion 21Ae at only the right side thereof, and is not connected to other portion of the gate pad 21A at the left side thereof. The seventh portion 21Ag overlaps the lower-side portions of all electrode sets G4, is connected to the fifth portion 21Ae at only the right side thereof, and is not connected to other portion of the gate pad 21A at the left side thereof.

With the gate pad 21A of such a shape, the signal received at the first portion 21Aa can reach a terminal of each portion without need to travel in a certain direction and then travel back in the opposite direction. Thus, like the first embodiment, the signal received at the first portion 21Aa can efficiently reach all contacts 14. Furthermore, since there is no area which is completely surrounded by the gate pad 21A, the continuous source pad 22A, which covers the entire area other than the area where the gate pad 21A is provided, can be provided, like the first embodiment.

Furthermore, the semiconductor device 1A of the second embodiment has a larger effective area than an area (effective area) in which the xy plane of the semiconductor device 1 of the first embodiment is effectively utilized.

According to the second embodiment, the area that cannot effectively be utilized as described above is narrower than in the first embodiment. According to a unit area UA of a certain size, the effective area in the first embodiment is 950UA, while the effective area in the second embodiment is 961UA.

The above description relates to the example in which the first portion 21Aa of the gate pad 21A is located on the right side on the xy plane. The second embodiment is not limited to this example. For example, the semiconductor device 1A may include a structure of mirror image of the described structure with respect to the y axis. In this case, the first portion 21Aa of the gate pad 21A is located at the upper left of the semiconductor device 1A. Shapes and arrangements of other elements can be known by analogy, and are not described in detail.

Third Embodiment

A third embodiment differs from the first embodiment in the arrangement of the electrode sets G, and the shapes of the gate pad 21 and source pad 22. For distinction from the first embodiment, the semiconductor device 1 of the third embodiment is referred to as "semiconductor device 1B". Different points from the first embodiment will mainly be described below.

Figure 10:
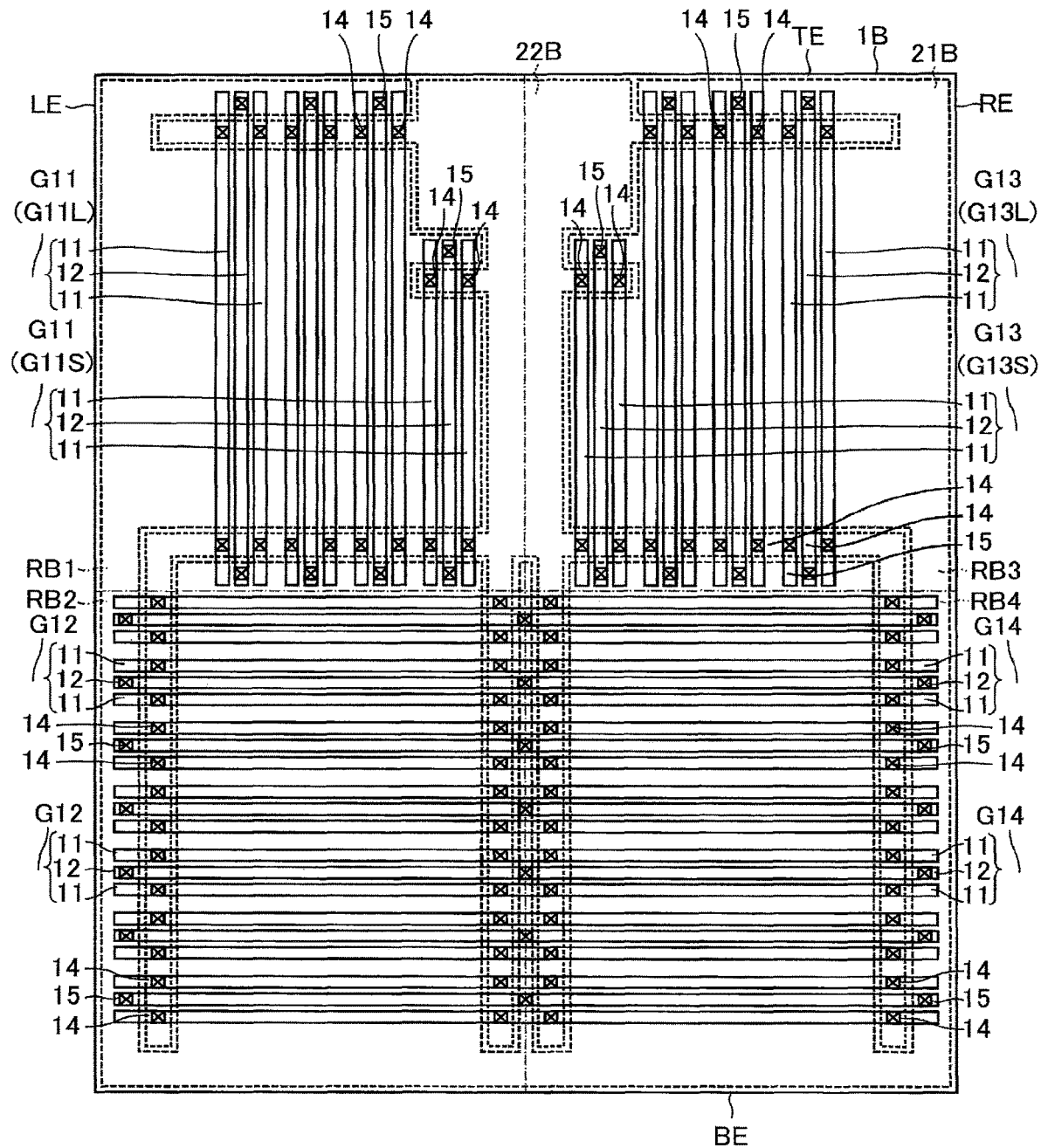
FIG. 10 illustrates a plan-view structure of a semiconductor device of a third embodiment.
Figure 11:
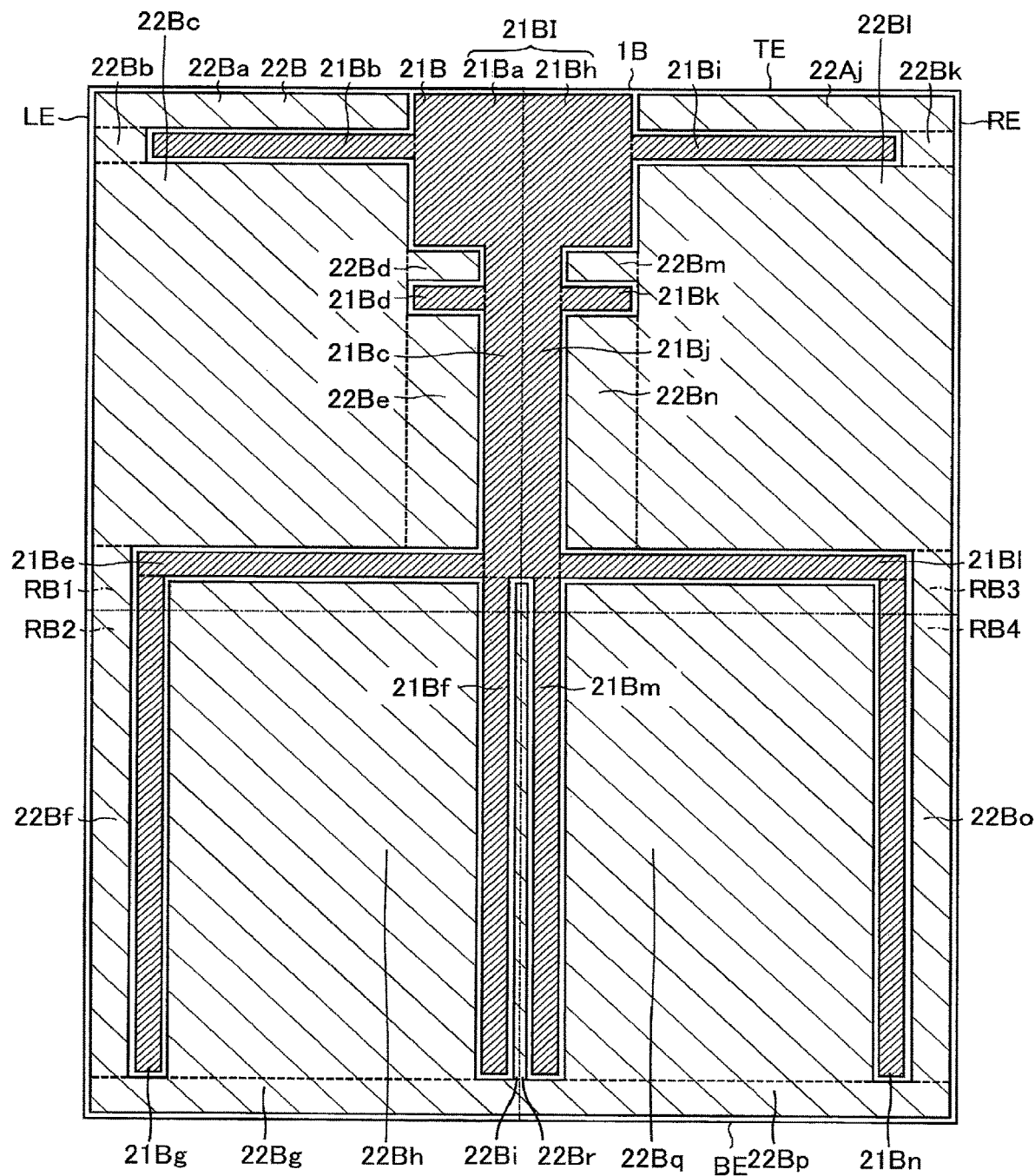
FIG. 11 illustrates a plan-view structure of the semiconductor device of the third embodiment.

FIG. 10 and FIG. 11 illustrate structures along an xy plane of the semiconductor device 1B of the third embodiment. FIG. 10 and FIG. 11 illustrate structures at different coordinates on the z axis. FIG. 11 illustrates a structure at a z-axis coordinate greater than the z-axis coordinate at which the structure is shown in FIG. 10.

The semiconductor device 1B includes a gate pad 21 and a source pad 22. The gate pad 21 and source pad 22 of the third embodiment may be referred to as "gate pad 21B" and "source pad 22B", respectively, to be distinguished from those in the first embodiment.

As illustrated in FIG. 10 and FIG. 11, the semiconductor device 1B of the third embodiment includes such a plan-view structure in which the plan-view structure of the semiconductor device 1 of the first embodiment and a structure of mirror image of the plan-view structure of the semiconductor device 1 with respect to the y axis are juxtaposed along the x axis.

As illustrated in FIG. 10 and FIG. 11, the semiconductor device 1B includes a first region RB1, a second region RB2, a third region RB3 and a fourth region RB4. The first region RB1 to fourth region RB4 spread along the xy plane and do not overlap each other. For example, the entire plane along the xy plane of the semiconductor device 1B is divided into the first region RB1 to fourth region RB4. For example, the first region RB1 and second region RB2 occupy a left half of the entire plane along the xy plane of the semiconductor device 1B. The first region RB1 occupies an upper section of the left half of the semiconductor device 1B. The second region RB2 occupies a lower section of the left half of the semiconductor device 1B. The third region RB3 and fourth region RB4 occupy a right half of the entire plane along the xy plane of the semiconductor device 1B. The third region RB3 occupies an upper section of the right half of the semiconductor device 1B. The fourth region RB4 occupies a lower section of the right half of the semiconductor device 1B.

The structures of the first region RB1 and second region RB2 are basically the same as the structures of the first region R1 and second region R2, except that the dimensions in the x axis are different.

The structure of the set of the third region RB3 and fourth region RB4 are equal to a structure of mirror image of the structure of the set of the first region RB1 and second region RB2 with respect to the y axis. In addition, a part of the gate pad 21B in the first region RB1 is connected to a part of the gate pad 21B in the third region RB3, and a part of the source pad 22B in the second region RB2 is connected to a part of the source pad 22B in the fourth region RB4. More specific structure is as follows.

The semiconductor device 1B includes electrode sets G11, G12, G13 and G14. The electrode sets G11 and G12 have the same features as the electrode sets G1 and G2 of the first embodiment, and are located in the first region RB1 and second region RB2, respectively. The electrode sets G11 include electrode sets G11S and G11L. The electrode sets G11S and G11L have the same features as the electrode sets G1S and G1L of the first embodiment.

The electrode sets G13 include electrode sets G13S and G13L. The electrode sets G13S and G13L have the same features as the electrode sets G1S and G1L. The electrode sets G13S and G13L have such an arrangement that the arrangement of the electrode sets G1S and G1L is reversed along the y axis. The electrode sets G14 have the same features as the electrode sets G2.

Each electrode set G12 is located on an extension line of the electrode set G14, and one electrode set G12 and one electrode set G14 which are arranged along the x axis are connected to each other. Specifically, in the second region RB2 and fourth region RB4, the gate electrodes 11 and FP electrodes 12 extend between the left edge LE and right edge RE of the semiconductor device 1B.

As illustrated in FIG. 10 and FIG. 11, in particular, in FIG. 11, the gate pad 21B includes a first portion 21Ba, a second portion 21Bb, a third portion 21Bc, a fourth portion 21Bd, a fifth portion 21Be, a sixth portion 12Bf, a seventh portion 21Bg, an eighth portion 21Bh, a ninth portion 21Bi, a tenth portion 21Bj, an eleventh portion 21Bk, a twelfth portion 21Bl, a thirteenth portion 21Bm, and a fourteenth portion 21Bn.

The first portion 21Ba, second portion 21Bb, third portion 21Bc, fourth portion 21Bd, fifth portion 21Be, sixth portion 12Bf and seventh portion 21Bg have the same features as the first portion 21$a$, second portion 21$b$, third portion 21$c$, fourth portion 21$d$, fifth portion 21$e$, sixth portion 12$f$ and seventh portion 21$g$ of the gate pad 21 of the first embodiment, respectively, except that the dimensions in the x axis are different.

The eighth portion 21Bh, ninth portion 21Bi, tenth portion 21Bj, eleventh portion 21Bk, twelfth portion 21Bl, thirteenth portion 21Bm and fourteenth portion 21Bn have the same features as the first portion 21Ba, second portion 21Bb, third portion 21Bc, fourth portion 21Bd, fifth portion 21Be, sixth portion 12Bf and seventh portion 21Bg, respectively, except that they are symmetrical about the y axis.

The description of the right edge RE of the semiconductor device 1 of the first embodiment is applicable as a description of a boundary between a set of the first region RB1 and second region RB2 of the third embodiment and a set of the third region RB3 and fourth region RB4 of the semiconductor device 1B.

A right side of the first portion 21Ba is connected to a left side of the eighth portion 21Bh. The set of the first portion 21Ba and eighth portion 21Bh receives a signal which is applied to the gate pad 21B, and is referred to as "input portion 21BI".

A right side of the third portion 21Bc is connected to a left side of the tenth portion 21Bj.

The source pad 22B includes a first portion 22Ba, a second portion 22Bb, a third portion 22Bc, a fourth portion 22Bd, a fifth portion 22Be, a sixth portion 22Bf, a seventh portion 22Bg, an eighth portion 22Bh, a ninth portion 22Bi, a tenth portion 22Bj, an eleventh portion 22Bk, a twelfth portion 22Bl, a thirteenth portion 22Bm, a fourteenth portion 22Bn, a fifteenth portion 22Bo, a sixteenth portion 22Bp, a seventeenth portion 22Bq, and an eighteenth portion 22Br.

The first portion 22Ba, second portion 22Bb, third portion 22Bc, fourth portion 22Bd, fifth portion 22Be, sixth portion 22Bf, seventh portion 22Bg, eighth portion 22Bh and ninth portion 22Bi have the same features as the first portion 22$a$, second portion 22$b$, third portion 22$c$, fourth portion 22$d$, fifth portion 22$e$, sixth portion 22$f$, seventh portion 22$g$, eighth portion 22$h$ and ninth portion 22$i$ of the source pad 22 of the first embodiment, respectively, except that the dimensions in the x axis are different.

The tenth portion 22Bi, eleventh portion 22Bk, twelfth portion 22Bl, thirteenth portion 22Bm, fourteenth portion 22Bn, fifteenth portion 22Bo, sixteenth portion 22Bp, seventeenth portion 22Bq and eighteenth portion 22Br have the same features as the first portion 22Ba, second portion 22Bb, third portion 22Bc, fourth portion 22Bd, fifth portion 22Be, sixth portion 22Bf, seventh portion 22Bg, eighth portion 22Bh and ninth portion 22Bi, respectively, except that they are symmetrical about the y axis.

A right side of the seventh portion 22Bg is connected to a left side of the sixteenth portion 22Bp. A right side of the ninth portion 22Bi is connected to a left side of the eighteenth portion 22Br.

At the boundary between the regions RB2 and RB4, too, the FP electrodes 12 in the regions RB2 and RB4 are connected to the contacts 15.

A signal applied to the gate pad 21B is received at the input portion 21BI. In the first region RB1 and second region RB2, the received signal is transmitted in the same manner as in the first region R1 and second region R2 of the first embodiment. As regards the travel of the signal in the third region RB3 and fourth region RB4, a description of the travel of the signal in the first regions RB1 and RB2 of a version with the directions of the traveling signal reversed with respect to the y axis is applicable.

In addition, the signal received at the input portion 21BI travels to the right in the ninth portion 21Bi and reaches the right side of the ninth portion 21Bi, and, in this process, the signal passes through the positions of the upper-side contacts 14 of the gate electrodes 11 of all electrode sets G13L. Further, the received signal reaches the right side of the eleventh portion 21Bk, and, in this process, the signal passes through the upper-side contacts 14 of the gate electrodes 11 of all electrode sets G13S. Besides, the received signal travels downward in the tenth portion 21Bj and thirteenth portion 21Bm and reaches the lower side of the thirteenth portion 21Bm, and, in this process, the signal passes through the positions of the left-side contacts 14 of the gate electrodes 11 of all electrode sets G14.

Furthermore, the signal received at the input portion 21BI travels downward in the tenth portion 21Bj, travels to the right in the twelfth portion 21Bl, reaches the right side of the twelfth portion 21Bl, travels downward in the fourteenth portion 21Bn, and reaches the lower side of the fourteenth portion 21Bn. In this process, the signal passes through the positions of the lower-side contacts 14 of the gate electrodes 11 of all electrode sets G13, and passes through the positions of the right-side contacts 14 of the gate electrodes 11 of all electrode sets G14.

The semiconductor device 1B of the third embodiment includes a plan-view structure of the semiconductor device 1 of the first embodiment in the first region RB1 and second region RB2, and includes a structure of mirror image of the first region RB1 and second region RB2 with respect to the y axis in the third region RB3 and fourth region RB4. With the gate pad 21A of such a shape, the signal received at the input portion 21BI can reach a terminal of each portion without need to travel in a certain direction and then travel back in the opposite direction. Thus, the same advantageous effects as in the first embodiment can be obtained. Furthermore, also in the third embodiment, since there is no area which is completely surrounded by the gate pad 21B, the continuous source pad 22B, which covers the entire area other than the area where the gate pad 21B is provided, can be provided.

The above description relates to the example in which the input portion 21BI of the gate pad 21B is located at the center between the left edge LE and right edge RE of the semiconductor device 1B. The third embodiment is not limited to this example. The input portion 21BI may be located at a position deviating to the left or right from the center. Specifically, the boundary between the set of the first region RB1 and second region RB2 and the set of the third region RB3 and fourth region RB4 can be located at any selected position between the left edge LE and right edge RE of the semiconductor device 1B.

The above description relates to the example in which the semiconductor device 1B of the third embodiment includes the plan-view structure of the semiconductor device 1 of the first embodiment, and the structure of the mirror image of the plan-view structure of the semiconductor device 1 with respect to the y axis. Instead, the semiconductor device 1B of the third embodiment may include a plan-view structure of the semiconductor device 1A of the second embodiment, and a structure of mirror image of the plan-view structure of the semiconductor device 1A with respect to the y axis. Specifically, the semiconductor device 1B may include a plan-view structure of the semiconductor device 1A of the second embodiment in the first region RB1 and second region RB2, and include a structure of mirror image of the plan-view structure of the semiconductor device 1A with respect to the y axis in the third region RB3 and fourth region RB4.

Fourth Embodiment

A fourth embodiment differs from the first embodiment in the arrangement of the electrode sets G, and the shapes of the gate pad 21 and source pad 22. For distinction from the first embodiment, the semiconductor device 1 of the fourth embodiment is referred to as "semiconductor device 1C". Different points from the first and third embodiments will mainly be described below, and a description of points, which can be known by a person skilled in the art by analogy from the first to third embodiments, will be omitted.

Figure 12:
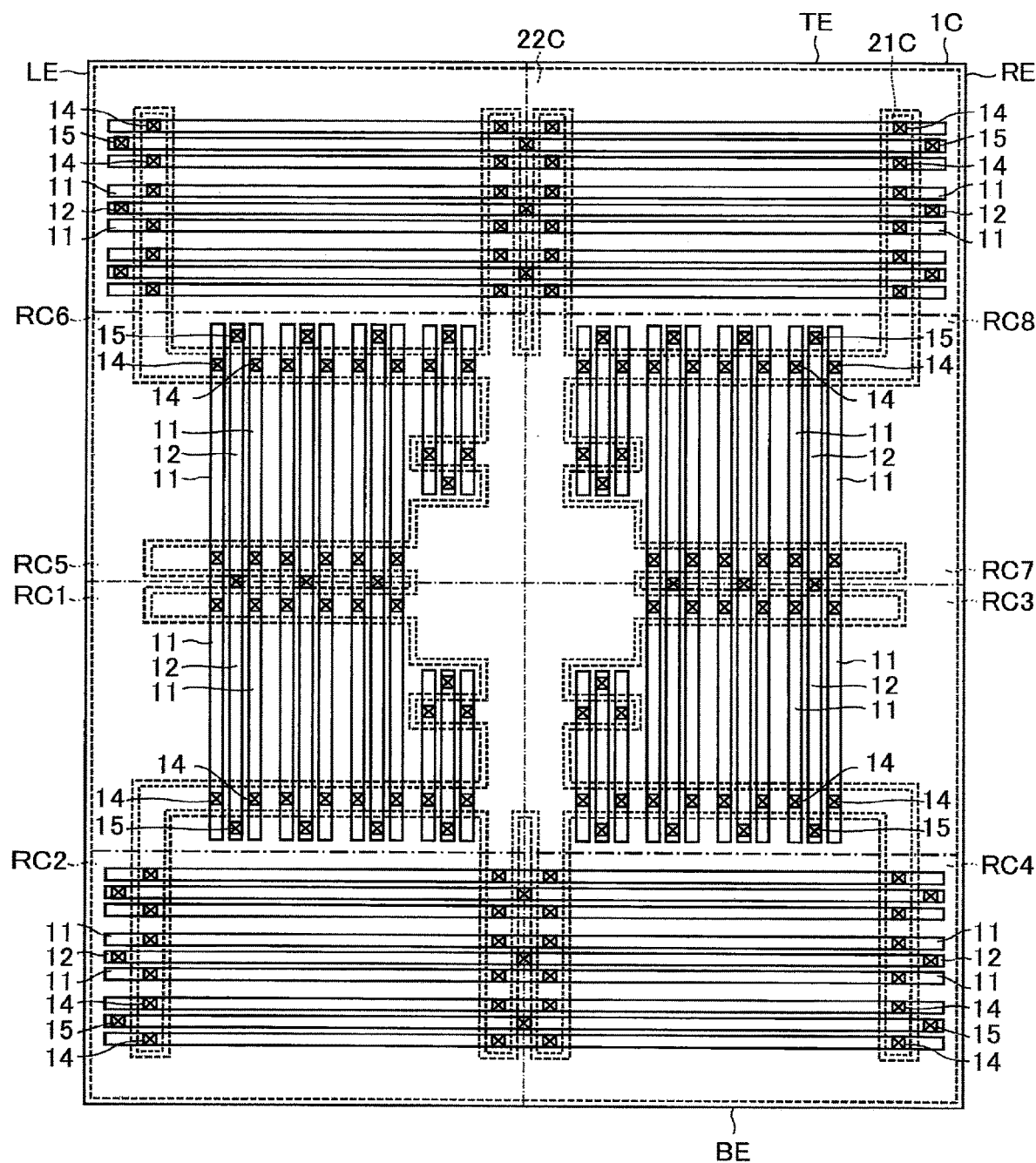
FIG. 12 illustrates a plan-view structure of a semiconductor device of a fourth embodiment.

FIG. 12 and FIG. 13 illustrate structures along an xy plane of the semiconductor device 1C of the fourth embodiment. FIG. 12 and FIG. 13 illustrate structures at different coordinates on the z axis. FIG. 13 illustrates a structure at a z-axis coordinate greater than the z-axis coordinate at which the structure is shown in FIG. 12.

The semiconductor device 1C includes a gate pad 21 and a source pad 22. The gate pad 21 and source pad 22 of the fourth embodiment may be referred to as "gate pad 21C" and "source pad 22C", respectively, to be distinguished from those in the first embodiment.

As illustrated in FIG. 12 and FIG. 13, the semiconductor device 1C of the fourth embodiment includes such a plan-view structure in which plan-view structure of the semiconductor device 1B of the third embodiment and a structure of mirror image of the plan-view structure of the semiconductor device 1B with respect to the x axis are juxtaposed along the y axis.

The mirror image structure of the plan-view structure of the semiconductor device 1B with respect to the x axis can be known by analogy from the description in the third embodiment with respect to the mirror image structure of the semiconductor device 1 of the first embodiment with respect to the y axis.

As illustrated in FIG. 12 and FIG. 13, the semiconductor device 1C includes a first region RC1, a second region RC2, a third region RC3, a fourth region RC4, a fifth region RC5, a sixth region RC6, a seventh region RC7, and an eighth region RC8. The first region RC1 to eighth region RC8 spread along the xy plane, and do not overlap each other. For example, the entire plane along the xy plane of the semiconductor device 1C is divided into the first region RC1 to eighth region RC8. For example, the first region R1 to fourth region RC4 occupy a lower half of the entire plane along the xy plane of the semiconductor device 1C, and the fifth region RC5 to eighth region RC8 occupy an upper half of the semiconductor device 1C.

The fifth region RC5 and sixth region RC6 are located in the left half, the fifth region RC5 is located on the lower side, and the sixth region RC6 is located on the upper side. The seventh region RC7 and eighth region RC8 are located in the right half, the seventh region RC7 is located on the lower side, and the eighth region RC8 is located on the upper side.

The structures of the first region RC1, second region RC2, third region RC3 and fourth region RC4 are basically the same as the structures of the first region RB1, second region RB2, third region RB3 and fourth region RB4 of the semiconductor device 1B of the third embodiment, respectively, except that the dimensions in the x axis and y axis are different. Specifically, the gate pad 21C includes a first portion 21Ca, a second portion 21Cb, a third portion 21Cc, a fourth portion 21Cd, a fifth portion 21Ce, a sixth portion 21Cf, a seventh portion 21Cg, an eighth portion 21Ch, a ninth portion 21Ci, a tenth portion 21Cj, an eleventh portion 21Ck, a twelfth portion 21Cl, a thirteenth portion 21Cm, and a fourteenth portion 21Cn. The first portion 21Ca, second portion 21Cb, third portion 21Cc, fourth portion 21Cd, fifth portion 21Ce, sixth portion 21Cf, seventh portion 21Cg, eighth portion 21Ch, ninth portion 21Ci, tenth portion 21Cj, eleventh portion 21Ck, twelfth portion 21Cl, thirteenth portion 21Cm and fourteenth portion 21Cn have the same features as the first portion 21Ba, second portion 21Bb, third portion 21Bc, fourth portion 21Bd, fifth portion 21Be, sixth portion 21Bf, seventh portion 21Bg, eighth portion 21Bh, ninth portion 21Bi, tenth portion 21Bj, eleventh portion 21Bk, twelfth portion 21Bl, thirteenth portion 21Bm and fourteenth portion 21Bn, respectively, except that the dimensions in the y axis are different.

The structures of the fifth region RC5, sixth region RC6, seventh region RC7 and eighth region RC8 are equal to structures of the first region RC1, second region RC2, third region RC3 and fourth region RC4 a version reversed with respect to the x axis.

Each gate electrode 11 in the first region RC1 is connected to one gate electrode 11 in the fifth region RC5, thus constituting a continuous structure. Each FP electrode 12 in the first region RC1 is connected to one FP electrode 12 in the fifth region RC5, thus constituting a continuous structure.

Each gate electrode 11 in the third region RC3 is connected to one gate electrode 11 in the seventh region RC7, thus constituting a continuous structure. Each FP electrode 12 in the third region RC3 is connected to one FP electrode 12 in the seventh region RC7, thus constituting a continuous structure.

An upper side of the first portion 21Ca of the gate pad 21C in the first region RC1 is connected to a lower side of the mirror image structure of the first portion 21Ca of the gate pad 21C which is located in the fifth region RC5. An upper side of the eighth portion 21Ch of the gate pad 21C in the third region RC3 is connected to a lower side of the mirror image structure of the eighth portion 21Ch of the gate pad 21C which is located in the seventh region RC7. The set of the first portion 21Ca in the first region RC1, the mirror image structure of the first portion 21Ca in the fifth region RC5, the eighth portion 21Ch in the third region RC3 and the mirror image structure of the eighth portion 21Ch in the seventh region RC7 receives a signal that is applied to the gate pad 21C, and is referred to as "input portion 21CI".

That part of the first region RC1 in the source pad 22C, which is located at the boundary with the fifth region RC5, is connected to that part of the fifth region RC5 of the source pad 22C, which is located at the boundary with the first region RC1. That part of the third region RC3 in the source pad 22C, which is located at the boundary with the seventh region RC7, is connected to that part of the seventh region RC7 of the source pad 22C, which is located at the boundary with the third region RC3. Thus, the source pad 22C has a continuous structure over the entire top surface of the semiconductor device 1C.

The FP electrodes 12 in the regions RC1 and RC5 are connected to the contacts 15, also at the boundary between the regions RC1 and RC5. The FP electrodes 12 of the regions RC3 and RC7 are connected to the contacts 15, also at the boundary between the regions RC3 and RC7.

The semiconductor device 1C of the fourth embodiment includes such a structure in which the plan-view structure of the semiconductor device 1B of the third embodiment, and the mirror image structure of the plan-view structure of the semiconductor device 1B with respect to the x axis, are connected. Thus, as described in connection with the third embodiment, the same advantageous effects as in the first embodiment can be obtained.

The above description relates to the example in which the input portion 21CI of the gate pad 21C is located at the center of the semiconductor device 1C. The fourth embodiment is not limited to this example. The input portion 21CI may be located at a position deviating leftward, rightward, upward or downward from the center. Specifically, the boundary between the first region RC1 and third region RC3 and the boundary between the fifth region RC5 and seventh region RC7 may be located at any selected position between the left edge LE and right edge RE of the semiconductor device 1C. Alternatively or additionally, the boundary between the first region RC1 and fifth region RC5 and the boundary between the third region RC3 and seventh region RC7 may be located at any selected position between the upper edge TE and lower edge BE of the semiconductor device 1C.

The above description relates to the example in which the semiconductor device 1C of the fourth embodiment includes the plan-view structure of the semiconductor device 1 of the first embodiment, the mirror image structure of the plan-view structure of the semiconductor device 1 with respect to the y axis, the mirror image structure of the plan-view structure of the semiconductor device 1 with respect to the x axis, and the mirror image structure of the plan-view structure of the semiconductor device 1 with respect to the x axis and y axis. Instead, the semiconductor device 1C of the fourth embodiment may include the plan-view structure of the semiconductor device 1A of the second embodiment, a mirror image structure of the plan-view structure of the semiconductor device 1A with respect to the y axis, a mirror image structure of the plan-view structure of the semiconductor device 1A with respect to the x axis, and a mirror image structure of the plan-view structure of the semiconductor device 1A with respect to the x axis and y axis. Specifically, the semiconductor device 1C may include the plan-view structure of the semiconductor device 1A in the first region RB1 and second region RB2, the mirror image structure of the plan-view structure of the semiconductor device 1A with respect to the y axis in the third region RB3 and fourth region RB4, the mirror image structure of the plan-view structure of the semiconductor device 1A with respect to the x axis in the fifth region RB5 and sixth region RB6, and the mirror image structure of the plan-view structure of the semiconductor device 1A with respect to the x axis and y axis in the seventh region RB7 and eighth region RB8.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a semiconductor layer;
    a first electrode on the semiconductor layer, the first electrode extending along a first axis;
    a second electrode on the semiconductor layer, the second electrode extending along a second axis, the second axis being non-parallel to the first axis; and
    a fifth electrode including a first portion, a second portion, a third portion, the first portion crossing the first electrode, the second portion crossing the second electrode, and the third portion crossing the second electrode and being separate at a first end from the second portion, wherein
    the semiconductor layer includes:
    a first semiconductor layer of a first conductivity type, the first semiconductor layer facing a third electrode with a first insulator between the third electrode and the first semiconductor layer;
    a second semiconductor layer of a second conductivity type, the second semiconductor layer being in contact with the first semiconductor layer and facing the first electrode with a second insulator between the first electrode and the second semiconductor layer; and
    a third semiconductor layer of the first conductivity type, the third semiconductor layer being in contact with the second semiconductor layer.

2. The semiconductor device of claim 1, further comprising:
    a fourth electrode on the semiconductor layer, the fourth electrode extending along the second axis, wherein
    the third electrode is on the semiconductor layer and extends along the first axis.

3. The semiconductor device of claim 1, further comprising a sixth electrode that is in a layer in which the fifth electrode is located and is electrically coupled to the third electrode and the fourth electrode.

4. The semiconductor device of claim 3, further comprising a contact that is in contact with the sixth electrode and the third electrode.

5. The semiconductor device of claim 2, wherein
    the semiconductor layer includes a third insulator which is in the first semiconductor layer, includes the first insulator and the second insulator, and surrounds the first electrode and the third electrode.

6. The semiconductor device of claim 5, wherein
the first electrode, the third electrode and the second semiconductor layer extend along the first axis, and
the third electrode and the second semiconductor layer sandwich the first electrode.

7. The semiconductor device of claim 6, wherein
the third electrode faces a part of the first semiconductor layer with an area of the third insulator below the first electrode between the third electrode and the first semiconductor layer.

8. The semiconductor device of claim 7, further comprising:
a sixth electrode which is in a layer in which the fifth electrode is located, and
a contact that is in contact with the sixth electrode and the third electrode.

9. The semiconductor device of claim 8, wherein
the first electrode has a linear shape,
the second electrode has a linear shape and is separate from the first electrode,
the third electrode has a linear shape and is separate from the first electrode and the second electrode, and
the fourth electrode has a linear shape and is separate from the first electrode, the second electrode, and the third electrode.

10. The semiconductor device of claim 9, wherein
the first portion of the fifth electrode crosses the third electrode,
the second portion of the fifth electrode crosses the fourth electrode, and
the third portion of the fifth electrode crosses the fourth electrode.

11. The semiconductor device of claim 10, wherein
the sixth electrode includes a first portion, a second portion, a third portion, a fourth portion, and a fifth portion,
the first portion of the sixth electrode overlaps the third electrode between the fourth portion of the fifth electrode and an edge of the semiconductor device,
the second portion of the sixth electrode overlaps the third electrode between the fourth portion of the fifth electrode and the first portion of the fifth electrode,
the third portion of the sixth electrode overlaps the fourth electrode between the second portion of the fifth electrode and an edge of the semiconductor device,
the fourth portion of the sixth electrode overlaps the fourth electrode between the third portion of the fifth electrode and an edge of the semiconductor device, and
the fifth portion of the sixth electrode overlaps the third electrode and the fourth electrode in an area surrounded by the first portion of the fifth electrode, the second portion of the fifth electrode, and the third portion of the fifth electrode.

12. The semiconductor device of claim 2, wherein:
the first electrode is a first gate electrode,
the second electrode is a second gate electrode,
the third electrode is a first field plate electrode, and
the fourth electrode is a second field plate electrode.

13. The semiconductor device of claim 12, further comprising
a third gate electrode extending along the first axis,
a fourth gate electrode extending along the second axis,
a third field plate electrode extending along the first axis, and
a fourth field plate electrode extending along the second axis.

14. The semiconductor device of claim 1, wherein the semiconductor layer includes a fourth semiconductor layer of the second conductivity type, the fourth semiconductor layer being in contact with the second semiconductor layer and being electrically coupled to the third electrode and the fourth electrode.

15. A semiconductor device comprising:
a semiconductor layer;
a first electrode on the semiconductor layer, the first electrode extending along a first axis;
a second electrode on the semiconductor layer, the second electrode extending along a second axis, and being separate from the first electrode, the second axis being non-parallel to the first axis;
a fifth electrode including a first portion, a second portion, a third portion, the first portion crossing the first electrode, the second portion crossing the second electrode, and the third portion crossing the second electrode and being separate at a first end from the second portion;
a third electrode extending along the first axis, and being separate from the first electrode and the second electrode, the third electrode being a first field plate electrode; and
a fourth electrode extending along the second axis, and being separate from the first electrode, the second electrode, and the third electrode, the fourth electrode being a second field plate electrode, wherein
the first electrode is a first gate electrode, and
the second electrode is a second gate electrode.

16. The semiconductor device of claim 15, further comprising a sixth electrode which is in a layer in which the fifth electrode is located and is electrically coupled to the third electrode and the fourth electrode, wherein
the semiconductor layer includes:
a first semiconductor layer of a first conductivity type, the first semiconductor layer facing the third electrode with an insulator between the third electrode and the first semiconductor layer;
a second semiconductor layer of a second conductivity type, the second semiconductor layer being in contact with the first semiconductor layer and facing the first electrode with an insulator between the first electrode and the second semiconductor layer;
a third semiconductor layer of the first conductivity type, the third semiconductor layer being in contact with the second semiconductor layer; and
a fourth semiconductor layer of the second conductivity type, the fourth semiconductor layer being in contact with the second semiconductor layer and sixth electrode.

17. The semiconductor device of claim 16, wherein
the fifth electrode further comprises a fourth portion crossing the first electrode and the third electrode and being separate at a first end from the first portion.

18. The semiconductor device of claim 17, wherein
the first portion and the fourth portion of the fifth electrode extend along the second axis, and
the second portion and the third portion of the fifth electrode extend along the first axis.

19. The semiconductor device of claim 15, further comprising a sixth electrode which is in a layer in which the fifth electrode is located and is electrically coupled to the third electrode and the fourth electrode, wherein
the semiconductor layer includes:

a first semiconductor layer of a first conductivity type, the first semiconductor layer facing the fourth electrode with an insulator between the fourth electrode and the first semiconductor layer;

a second semiconductor layer of a second conductivity type, the second semiconductor layer being in contact with the first semiconductor layer and facing the first electrode with an insulator between the first electrode and the second semiconductor layer;

a third semiconductor layer of the first conductivity type, the third semiconductor layer being in contact with the second semiconductor layer; and a fourth semiconductor layer of the second conductivity type, the fourth semiconductor layer being in contact with the second semiconductor layer and sixth electrode.

20. The semiconductor device of claim 15, further comprising a sixth electrode which is in a layer in which the fifth electrode is located and is electrically coupled to the third electrode and the fourth electrode, wherein the sixth electrode includes a first portion, a second portion, a third portion, a fourth portion, and a fifth portion, the first portion of the sixth electrode overlaps the third electrode between the fourth portion of the fifth electrode and an edge of the semiconductor device, the second portion of the sixth electrode overlaps the third electrode between the fourth portion of the fifth electrode and the first portion of the fifth electrode, the third portion of the sixth electrode overlaps the fourth electrode between the second portion of the fifth electrode and an edge of the semiconductor device, the fourth portion of the sixth electrode overlaps the fourth electrode between the third portion of the fifth electrode and an edge of the semiconductor device, and the fifth portion of the sixth electrode overlaps the third electrode and the fourth electrode in an area surrounded by the first portion of the fifth electrode, the second portion of the fifth electrode, and the third portion of the fifth electrode.

21. The semiconductor device of claim 20, wherein the semiconductor layer includes:

a first semiconductor layer of a first conductivity type, the first semiconductor layer facing the third electrode with an insulator between the third electrode and the first semiconductor layer;

a second semiconductor layer of a second conductivity type, the second semiconductor layer being in contact with the first semiconductor layer and facing the first electrode with an insulator between the first electrode and the second semiconductor layer;

a third semiconductor layer of the first conductivity type, the third semiconductor layer being in contact with the second semiconductor layer; and a fourth semiconductor layer of the second conductivity type, the fourth semiconductor layer being in contact with the second semiconductor layer and sixth electrode.

22. The semiconductor device of claim 17, wherein:

the semiconductor device includes:

a plurality of first electrodes which includes the first electrode and extend along the first axis; and a plurality of second electrodes which includes the second electrode and extend along the second axis, and the first portion of the fifth electrode crosses the first electrodes, the second portion of the fifth electrode crosses the second electrodes, the third portion of the fifth electrode crosses the second electrodes, and the fourth portion of the fifth electrode crosses the first electrodes.

23. The semiconductor device of claim 22, wherein:

the semiconductor device includes:

a plurality of third electrodes which includes the third electrode and extend along the first axis; and a plurality of fourth electrodes which includes the fourth electrode and extend along the second axis, and the first portion of the fifth electrode crosses the third electrodes, the second portion of the fifth electrode crosses the fourth electrodes, the third portion of the fifth electrode crosses the fourth electrodes, and the fourth portion of the fifth electrode crosses the third electrodes.

24. The semiconductor device of claim 15, further comprising a third gate electrode extending along the first axis, a fourth gate electrode extending along the second axis, a third field plate electrode extending along the first axis, and a fourth field plate electrode extending along the second axis.

* * * * *